US007466245B2

(12) United States Patent
Unno

(10) Patent No.: US 7,466,245 B2
(45) Date of Patent: Dec. 16, 2008

(54) DIGITAL SIGNAL PROCESSING APPARATUS, DIGITAL SIGNAL PROCESSING METHOD, DIGITAL SIGNAL PROCESSING PROGRAM, DIGITAL SIGNAL REPRODUCTION APPARATUS AND DIGITAL SIGNAL REPRODUCTION METHOD

(75) Inventor: Yukiko Unno, Tokyo (JP)

(73) Assignee: Sony Corporation, Tokyo (JP)

( * ) Notice: Subject to any disclaimer, the term of this patent is extended or adjusted under 35 U.S.C. 154(b) by 2 days.

(21) Appl. No.: 11/765,892

(22) Filed: Jun. 20, 2007

(65) Prior Publication Data

US 2008/0106445 A1 May 8, 2008

(30) Foreign Application Priority Data

Jun. 26, 2006 (JP) ............................ 2006-174980
May 31, 2007 (JP) ............................ 2007-145619

(51) Int. Cl.
*H03M 7/30* (2006.01)

(52) U.S. Cl. ........................ 341/50; 704/201; 704/219; 700/94; 375/240.12

(58) Field of Classification Search ....................... None
See application file for complete search history.

(56) References Cited

U.S. PATENT DOCUMENTS 4,447,886 A * 5/1984 Meeker ...................... 708/400
5,136,376 A * 8/1992 Yagasaki et al. ....... 375/240.23
6,141,448 A * 10/2000 Khansari et al. ....... 375/240.16
7,260,269 B2 * 8/2007 Guleryuz .............. 375/240.18
2008/0106445 A1 * 5/2008 Unno .......................... 341/60

FOREIGN PATENT DOCUMENTS

JP 2001-356788 12/2001
JP 2002-73096 3/2002
JP 2002-171588 6/2002

* cited by examiner

*Primary Examiner*—Howard Williams
(74) *Attorney, Agent, or Firm*—Finnegan, Henderson, Farabow, Garrett & Dunner, L.L.P.

(57) ABSTRACT

A digital signal processing apparatus includes: a detection section; a prediction section; and a decision section. The detection section is configured to detect a signal position at which a signal component may possibly have been removed from a digital signal in a signal conversion processed state upon the signal conversion process. The prediction section is configured to predict, based on data at correlating portions of the digital signal in the signal conversion processed state in a demodulation frequency band, data at the signal position prior to the removal detected by the detection section. The decision section is configured to decide whether or not the absolute value of the data at the signal position prior to the removal predicted by the prediction section is lower than a resolution at the signal position and adopt the predicted data prior to the removal as interpolation data.

10 Claims, 12 Drawing Sheets

DIGITAL SIGNAL PROCESSING APPARATUS, DIGITAL SIGNAL PROCESSING METHOD, DIGITAL SIGNAL PROCESSING PROGRAM, DIGITAL SIGNAL REPRODUCTION APPARATUS AND DIGITAL SIGNAL REPRODUCTION METHOD

CROSS REFERENCES TO RELATED APPLICATIONS

The present invention contains subject matter related to Japanese Patent Application JP 2006-174980 filed with the Japan Patent Office on Jun. 26, 2006, the entire contents of which being incorporated herein by reference.

BACKGROUND OF THE INVENTION

1. Field of the Invention

This invention relates to an apparatus, a method and a program for processing, and an apparatus and a method for reproducing, a digital signal obtained by a signal conversion process such as a digital audio signal in a form compression-coded using an irreversible compression method such as, for example, frequency correlation coding.

2. Description of the Related Art

A compression process of an audio signal is implemented by a combination of "quantization (PCM (Pulse Code Modulation) signal)", "time correlation coding" which uses time continuity of the audio signal, "frequency correlation coding" which uses the auditory sense of the human being and "entropy coding" which uses one-sidedness of the appearance probability of codes obtained by the coding methods mentioned.

The compression techniques mentioned above are standardized by the MPEG (Moving Picture Expert Group) system, ATRAC (Adaptive Transform Acoustic Coding® system, AC-3 (Audio Code Number 3® system, VMA (Windows Media Audio® system and so forth. At present, audio signals coded by such coding systems are used over a wide range in digital broadcasts, network audio players, portable telephone systems, Web streaming and so forth.

Among the compression processes, the "frequency correlation coding" has a significant influence on the compression ratio and the sound quality. The "frequency correlation coding" orthogonally transforms a quantized PCM signal from a time domain signal into a frequency domain signal, determines deviations in signal energy in the frequency region and uses the deviations to perform coding of the PCM signal thereby to raise the coding efficiency.

Further, in the "frequency correlation coding", the frequency band of the signal obtained by the orthogonal transform is divided into several sub bands using a psychological auditory sense and a kind of weighting is applied to the signal to quantize the signal so that signal deterioration in a frequency sub band which can be perceived comparatively readily is minimized thereby to improve the general coding quality.

In the coding which uses the psychological auditory sense characteristic, absolute audible threshold values and relative audible threshold values which depend upon a masking effect are used to determine correction audible threshold values. The correction audible threshold values are used for coding in the divisional sub bands. It is determined that those frequency components having a sound pressure lower than a lower one of the correction audible threshold values correspond to sound which may not be perceived by the human being. Such frequency components are cut or suppressed upon coding. Further, the absolute audio threshold values exhibit an increasing amplitude value in a high frequency band. Therefore, frequency components in a high frequency band are cut or suppressed more than in a low frequency band.

The compression method, for an audio signal which uses a psychological auditory sense characteristic is adopted positively by the MPEG system. The tendency of encoding of an audio signal is determined by the technical ability of encoder makers. However, in regard to an audio signal of digital broadcasting in which the MPEG system is adopted, also such a current situation is confirmed that, by the coding process described above, ail high frequency signals having frequencies higher than a certain frequency are cut or suppressed or, also within the audible frequency band, all signals in a certain divisional frequency band are cut or suppressed. Particularly where an audio signal is compressed at a low bit rate, since the number of bits which can be used for coding is small, a greater number of signals are cut by the method described above.

Several countermeasures for solving the problem of deterioration of the sound quality caused by signal deterioration by such compression coding are available as the related art. For example, Japanese Patent Laid-open No. 2002-171588, "Signal interpolation device, signal interpolation method and recording medium" (hereinafter referred to as Patent Document 1) discloses a technique regarding a method of interpolating high frequency components using an existing audio signal (interpolation object signal).

In particular, components within a first frequency band are extracted from within an interpolation object signal by means of a variable band-pass filter (BPF). Then, a logical oscillation signal from a variable frequency oscillator is mixed with the components within the first frequency band to form an interpolation signal of a second frequency band on the higher frequency band, side than the frequency band occupied by the interpolation object signal. Then, a sum signal of the interpolation signal and the interpolation object signal is outputted as an output signal.

Japanese Patent Laid-open No. 2001-356788, "Device and method for frequency interpolation and recording medium" (hereinafter referred to as Patent Document 2) discloses a technique of reconstructing a signal proximate to an original signal from a modulation wave obtained using the original signal after whose bandwidth is limited. In particular, a PCM signal is converted into a spectrum by an analyzer. Then, from among combinations of a reference band which includes the highest frequency from among frequency bands obtained by dividing the spectrum equally with the other frequency bands, that combination which exhibits the highest correlation of the spectrum distribution where one of the reference band and the other frequency band is standardized is specified by a frequency interpolation processing section.

Then, an envelope of the PCM signal is estimated by an interpolation band addition section, and a spectrum having a distribution same as the spectrum distribution in the reference band included in the specified combination is scaled by the frequency interpolation processing section so as to conform to a function of the envelope. Then, the scaled spectrum is added to the high frequency side with respect, to the reference band by the frequency interpolation processing section. Then, a signal which provides the resulting spectrum is produced by a synthesizer to reconstruct a signal proximate to the original signal.

Japanese Patent Laid-open No. 2002-073096, "Frequency interpolation system, frequency interpolation device, frequency interpolation method, and recording medium" (hereinafter referred to as Patent Document 3) discloses a method of recording information of missing signals upon coding of an original signal in advance and using, upon decoding, the recorded information to decode the original signal while maintaining the sound quality.

The techniques disclosed in Patent Documents 1, 2 and 3 are effective to solve the problem of deterioration of the sound quality.

SUMMARY OF THE INVENTION

However, the techniques disclosed in Patent Documents 1 and 2 are not satisfactory in the following point. In particular, where an existing music signal itself which is a digital audio signal formed by compression coding is cut or suppressed at certain portions in low and middle frequency bands which make an object, of a decoding process as indicated by broken lines in FIG. 1A, even if the audio signal in the cut or suppressed state is used to produce a high frequency signal, the produced high frequency signal includes cut or suppressed portions as indicated by broken lines in FIG. 1B.

Meanwhile, the technique disclosed in Patent Document 3 demands an algorithm common to the encoder and the decoder. This gives rise to such a restriction that the encoding process and the decoding process should be performed in the same apparatus. Therefore, it is considered that the technique is not suitable for universal use.

According to an embodiment of the present invention, there is provided a digital signal processing apparatus including a detection section, a prediction section, and a decision section. The detection section is configured to detect a signal position at which a signal component may possibly have been removed from a digital signal in a signal conversion processed state upon the signal conversion, process. The prediction, section is configured to predict, based on data at correlating portions of the digital signal in the signal conversion processed state in a demodulation frequency band which are estimated to have correlations to the signal position, data at the signal position prior to the removal detected by the detection section. The decision section is configured to decide whether or not the absolute value of the data at the signal position prior to the removal predicted by the prediction section is lower than a resolution at the signal position and adopt the predicted data prior to the removal as interpolation data when the absolute value is lower than the resolution.

In the digital signal processing apparatus, the detection section detects a signal position at which a signal component may possibly have been removed or cut from a digital signal formed by a signal conversion process of a processing object. Then, the prediction section predicts, based on data at correlating portions of the digital signal which are estimated to have correlations to the signal position, a digital signal component or data at the signal position.

Thereafter, the decision section decides whether or not the absolute value of the data at the signal position predicted by the prediction section is lower than a resolution at the signal position to decide whether or not the data at the signal position should be adopted as interpolation data. In particular, if the absolute value of the predicted data is equal to or higher than the resolution, then the data should not have been removed, and therefore, the decision section decides that the production has resulted in failure and does not adopt the data as interpolation data. However, if the predicted data is lower than the resolution, then since the possibility that the data may be the removed digital signal component is high, the decision section adopts the predicted data as interpolation data.

Consequently, a reconstruction process of a digital signal formed by a signal conversion process can be performed by predicting a digital signal component which may possibly have been removed upon the signal conversion process and adopting the digital signal component as interpolation data only if the digital signal component has been predictively removed with a high degree of possibility. Accordingly, even if the digital signal in the signal conversion processed state includes a signal component which has been removed upon the signal conversion process, the influence of the removed signal component, can be suppressed to the minimum. Consequently, a digital signal of improved qualify can be reconstructed.

Preferably, the prediction section predicts the data at the signal position prior to the removal based on existing digital signal components within the demodulation frequency band formed by the signal conversion process.

In the digital signal processing apparatus, the prediction section predicts, from existing digital signal components within the demodulation frequency band formed by the signal conversion process, the data at the signal position prior to the removal which may possibly have been removed upon the compression coding process.

Consequently, a digital signal component at the signal position at which the digital signal component may possibly have been removed can be reconstructed from existing digital signals in the demodulation frequency band obtained by the signal conversion process. Accordingly, even if the digital signal formed by the signal conversion process includes a signal component which has been removed upon the signal conversion process, the data which may possibly have been removed can be predicted appropriately such that it can be used as interpolation data. Consequently, the influence of the removed signal component can be suppressed to the minimum, and a digital signal of improved quality can be reconstructed.

Preferably, the digital signal processing apparatus further includes an addition section configured to reconstruct, from digital signal components in the demodulation frequency band formed by a signal conversion process after the digital signal is interpolated with the data adopted by the decision section from among the data at the removed position prior to the removal predicted by the prediction section, a frequency component in a higher frequency region than the demodulation frequency band and add the reconstructed frequency component.

In the digital signal processing apparatus, the addition section reconstructs, from digital signal components in the demodulation frequency band formed by a signal conversion process and including the data prior to the removal predicted based on existing digital signal components in the demodulation frequency band formed by the signal conversion process by the prediction section and adopted as interpolation data by the decision section, the frequency component in the higher frequency region which has been removed upon the signal conversion process. Then, the frequency component is added to the digital signal of the processing object.

Consequently, taking not only existing digital signal components in the demodulation frequency band formed by the signal conversion process but also the digital signal component at the signal position from which it has been removed upon the signal conversion process from among the existing digital signals in the modulation frequency band formed by the signal conversion process into consideration, the digital signal component, for example, in the higher frequency region which has been removed upon the signal conversion process. Consequently, the quality of the digital signal obtained by the signal conversion process can be improved.

The digital signal processing apparatus may be configured such that it further includes an addition section configured to reconstruct, from existing digital signal components in the demodulation frequency band formed by the signal conversion process, a frequency component in a higher frequency region than the demodulation frequency band and add the reconstructed frequency component. The detection section sets the digital signal to which the signal component in the frequency band higher than the demodulation frequency band is added by the addition section as a processing object.

In the digital signal processing apparatus, the addition section first reconstructs, from existing digital signal components in the demodulation frequency band formed by the signal conversion process, a frequency component in a higher frequency region which has been removed upon the signal conversion process and adds the reconstructed frequency component. Consequently, a digital signal in a state in which the digital signal components in all of the frequency bands of the high, middle and low frequency regions are compression coded is formed.

Then, from the thus formed digital signal in all of the frequency bands in the signal conversion processed state, a signal position at which a digital signal element may possibly have been removed upon the signal conversion process is detected. Then, the data at the signal position prior to the removal is predicted by the prediction section. Then, if the predicted data is adopted by the decision section, then the digital signal in the signal conversion processed state in which the predicted data is used as interpolation data is supplied.

Consequently, by adding digital signal components in the high frequency region to existing digital signal components in the demodulation frequency region of the middle and low frequency regions formed by the signal conversion process, a digital signal including those digital signal components, which may possibly have been removed, over all of the frequency bands of the high, middle and low frequency bands can be reconstructed. Consequently, the digital signal formed by the signal conversion process can be reconstructed in high quality.

In summary, with the digital signal processing apparatus, even if a digital signal of a processing object includes a signal component which has been removed or cut upon a signal conversion process, the signal element removed upon the signal conversion process can be predicted and produced and used as interpolation data. Consequently, the digital signal in the signal conversion processed state can be restored with high quality and used.

Further, with the digital signal processing apparatus, a digital signal obtained by a signal conversion process can be processed without the necessity to separately store and retain a signal component which has been removed or cat upon the signal conversion process from within the digital signal in the signal conversion processed state.

More particularly, even if a digital audio signal obtained by a compression coding process includes a signal component which has been removed or cut upon the compression coding process, data at the signal position at which the signal component has been removed upon the compression coding process is predicted and produced such that it can be used as interpolation data. Consequently, the quality of reproduction audio based on the compression coded digital audio signal can be improved.

Further, with the digital signal processing apparatus, a digital signal obtained by a compression coding process can be processed without the necessity to separately store and retain a signal component of a compression coded digital audio signal which has been removed or cut upon the compression coding process from within the digital audio signal in the compression coded state. Consequently, the digital signal processing apparatus is high in multiplicity of use.

Figure 9:
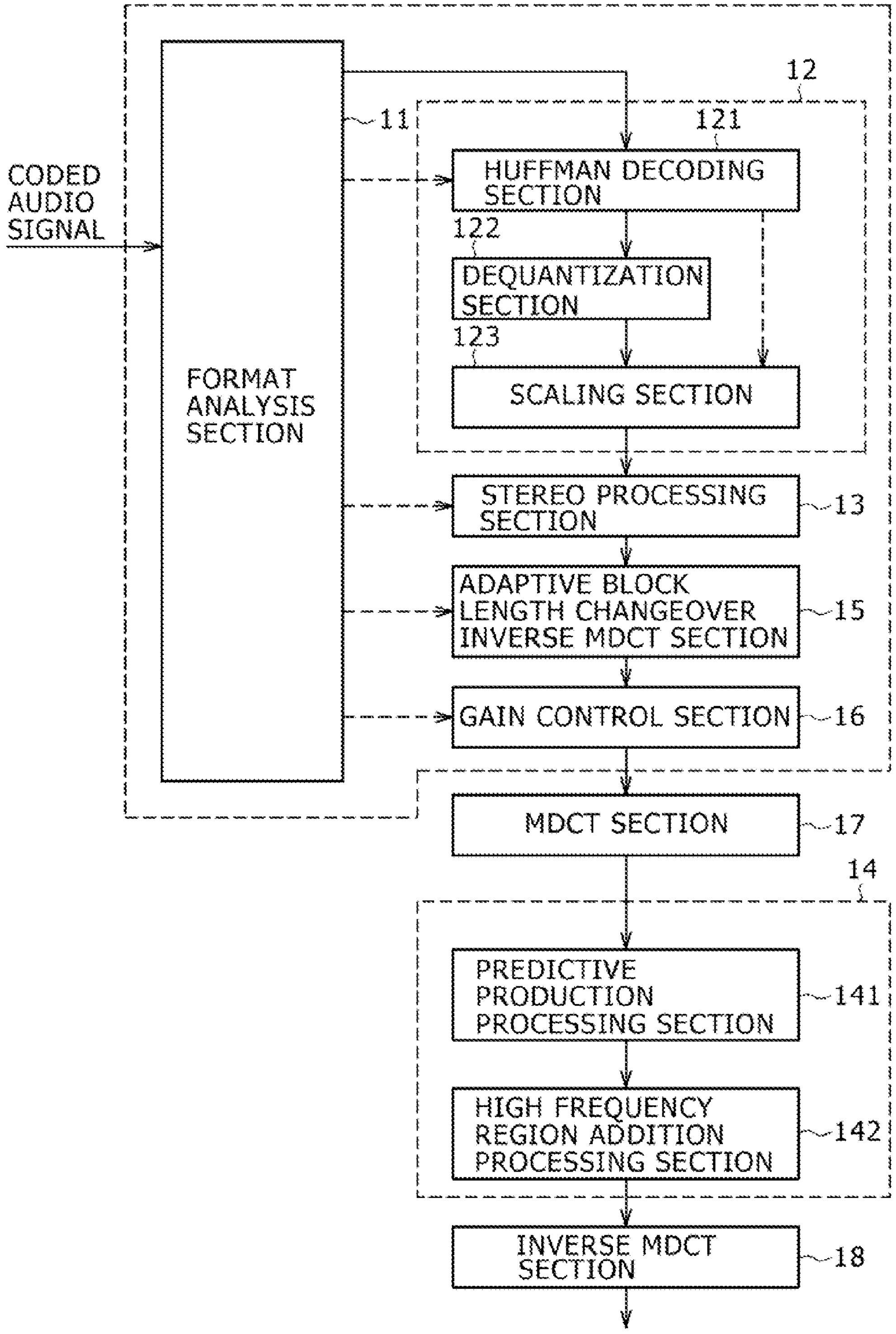
Figure 10:
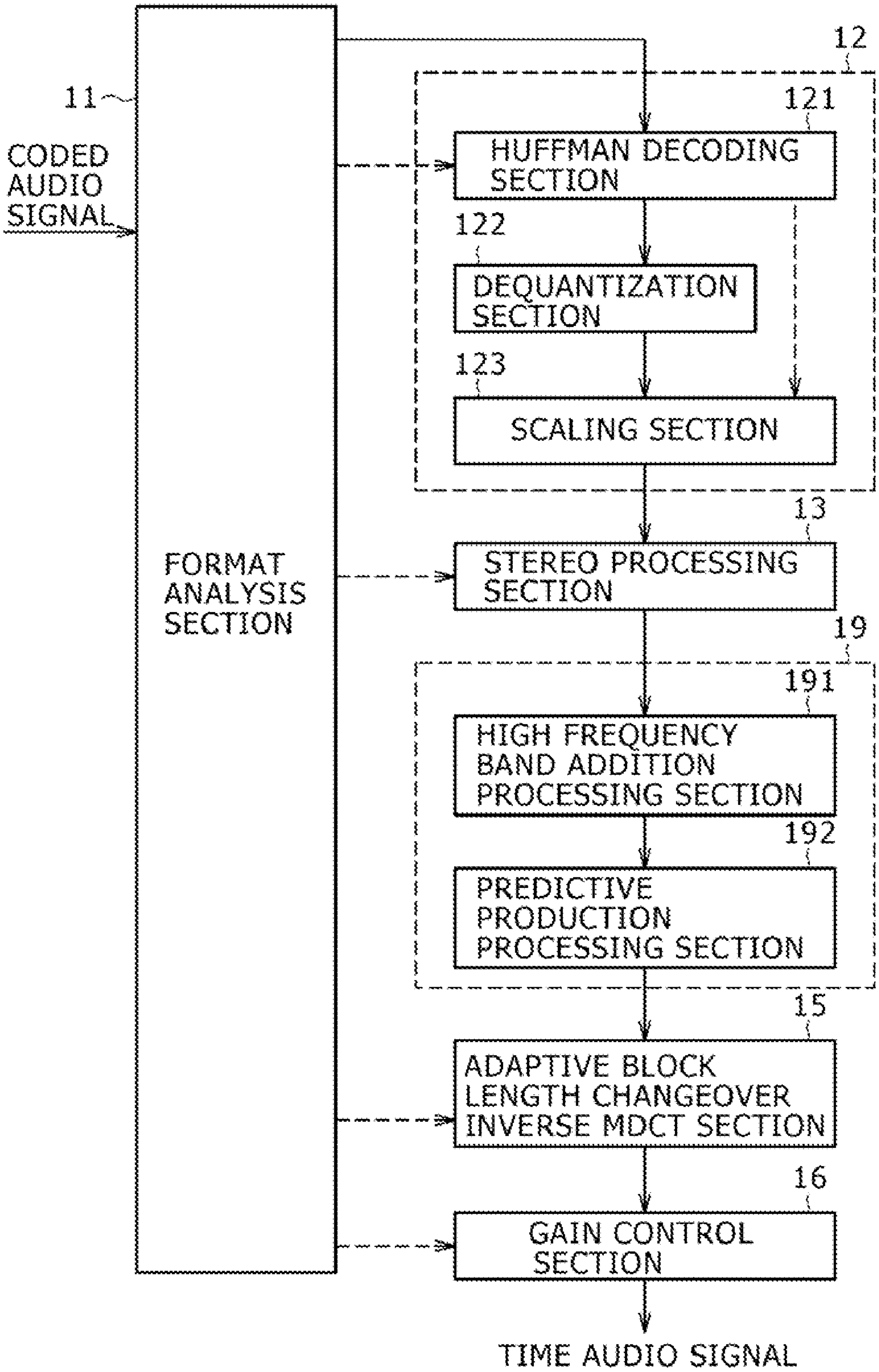
Figure 11A:
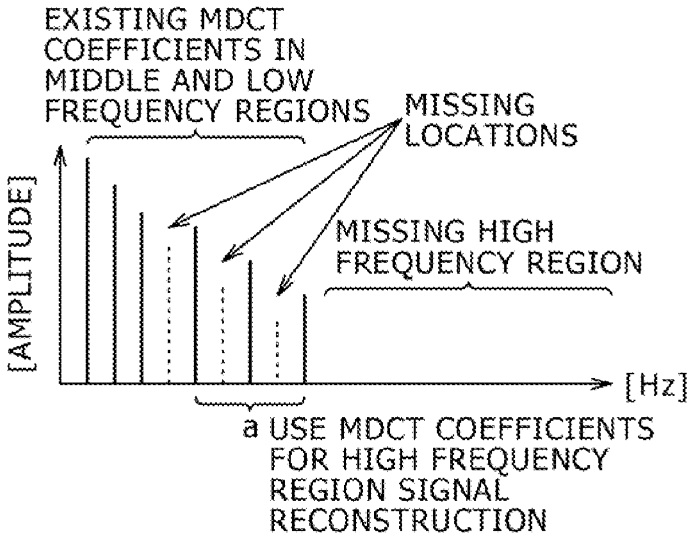
Figure 11B:
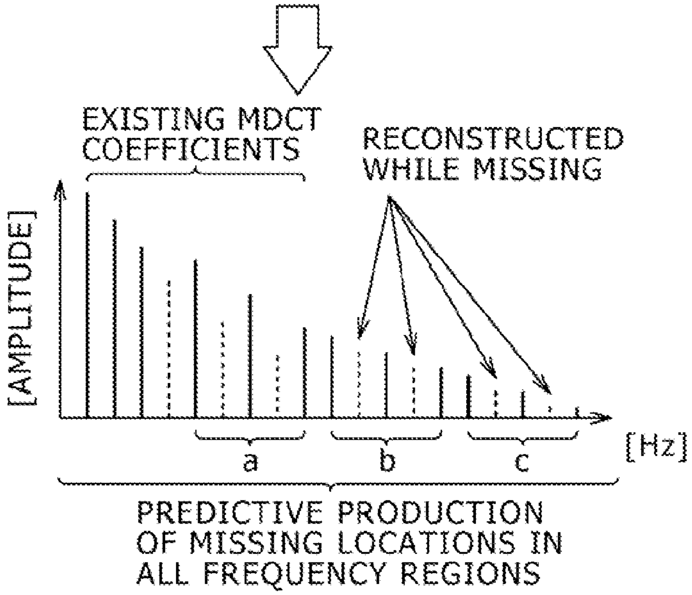
Figure 11C:
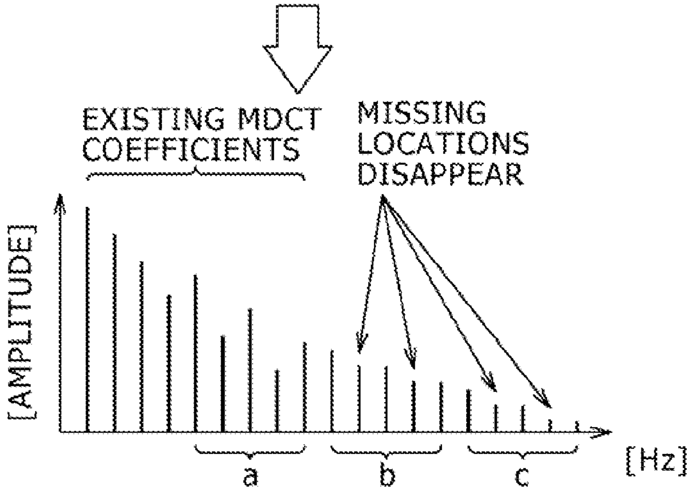
Figure 12:
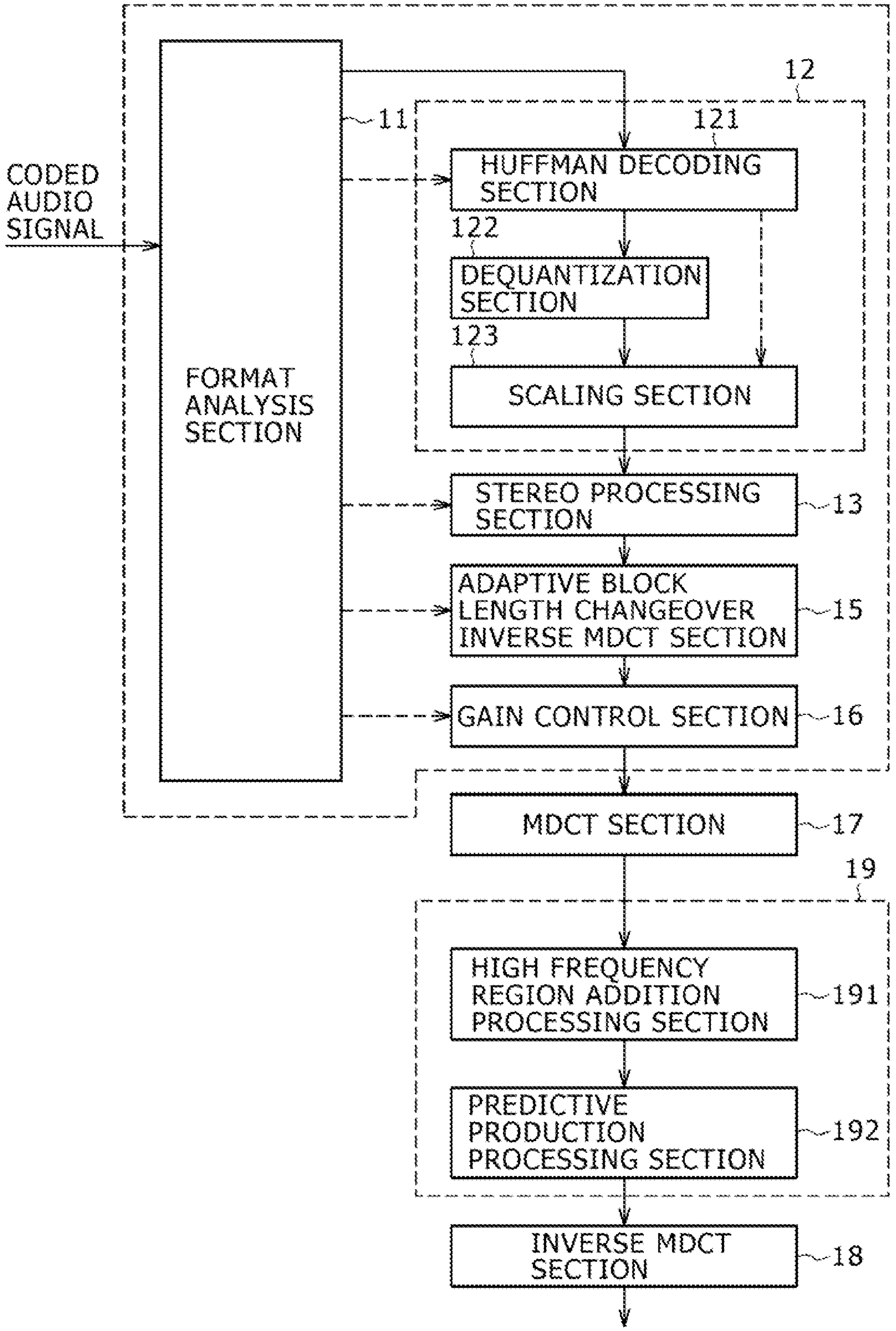
Figure 13A:
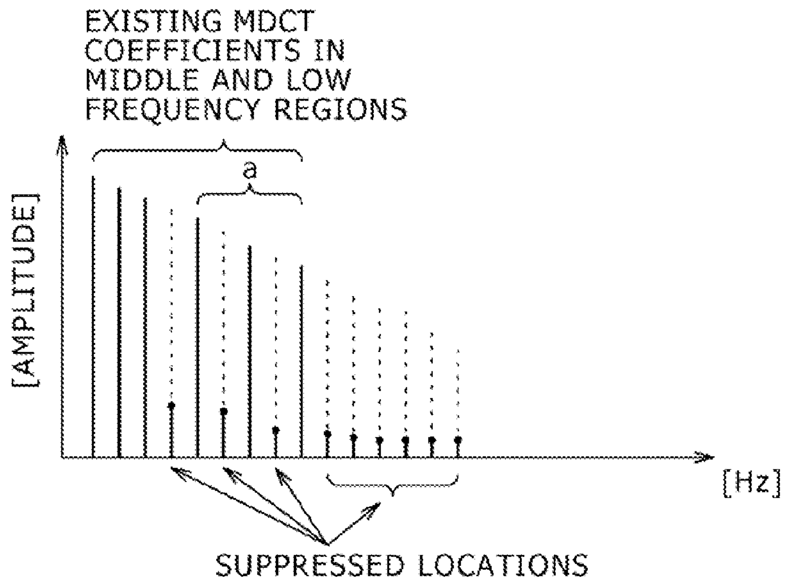
Figure 13B:
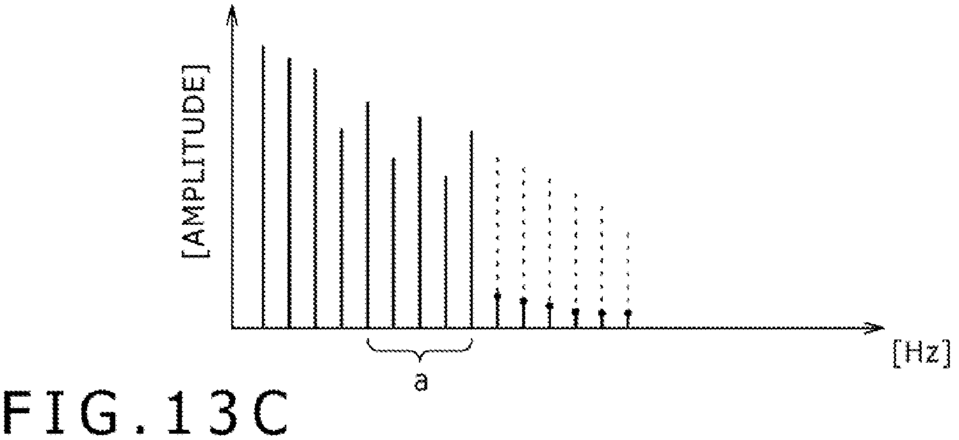
Figure 13C:
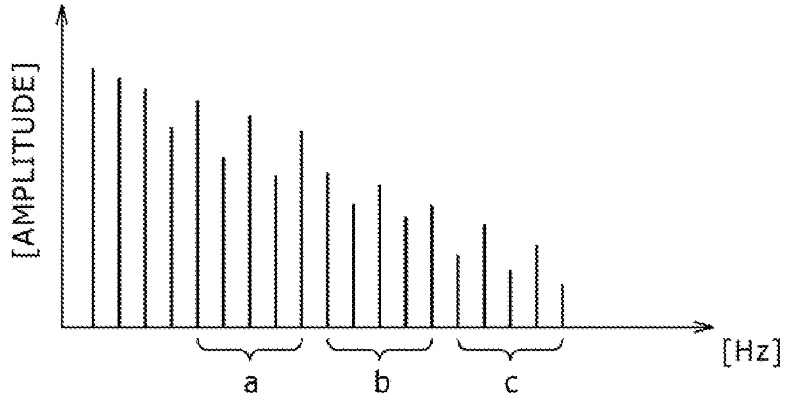

FIG. B is a block diagram showing an example of a configuration of a high frequency region addition processing section;

FIG. 9 is a block diagram showing a modification to the processing apparatus;

FIG. 10 is a block diagram showing another processing apparatus to which an embodiment of the present invention is applied;

FIGS. 11A, 11B and 11C are diagrammatic views illustrating a process executed by a missing signal reconstruction section;

FIG. 12 is a block diagram showing a modification to the processing apparatus; and FIGS. 13A, 13B and 13C are diagrammatic views illustrating reconstruction of a high frequency signal where an audio signal is partly suppressed.

DETAILED DESCRIPTION OF THE PREFERRED EMBODIMENTS

In the following, the present invention is described in connection with preferred embodiments thereof shown in the accompanying drawings. For the simplified description, it is assumed that an audio signal (coded audio signal) coded using a coding system of the ISO/IEC13818-7 standards called MPEG-2 AAC (Moving Picture Expert Group-2 Advanced Audio Coding) is decoded.

In other words, in the embodiments described below, a compression coding process of the MPEG-2 AAC system corresponds to a signal conversion process, and a coded audio signal formed by the compression coding process of the MPEG-2 AAC system corresponds to a digital signal obtained by a signal conversion process.

It is to be noted that, in the following description, the MPEG-2 AAC is referred to simply as AAC. Further, the ISO mentioned hereinabove is an abbreviation of the International Organization for Standardisation, and the IEC is an abbreviation of the International Electrotechnical Commission.

[Outline of a Coding Process of the AAC System]

In order to simplify description of a decoding process of a coded audio signal coded in accordance with the AAC system, an outline of a coding process of the AAC system is described. Audio coding of the AAC system is irreversible compression and raises the compression effect by eliminating conversion of sound in a region which may not be auditorily perceived by the human being into data based on the psycho acoustics. According to the coding of the AAC system, for example, in the case of a 2-channel audio signal, sound quality equivalent to that of a CD (Compact Disc) can be obtained even at a transmission rate of approximately 96 kilobits/second, and a compression ratio of approximately 1/15 (one fifteenth) can be obtained.

In the coding system for an audio signal according to the AAC system, (1) a gain adjustment process→(2) an adaptive block length changeover MDCT process→(3) a TNS process→(4) an intensity stereo coding process→(5) a prediction process→(6) an M/S stereo process→(7) a scaling process are performed based on a result of a psycho acoustic analysis. Then, (8) a quantization process and (9) a Huffman coding process are repeated until after the bit number becomes smaller than an allocated bit number to form coded audio data. Then, various coefficients and so forth to be added in a processing procedure are added to the coded audio data to form a coded audio signal (AAC bit stream).

An outline of contents of a particular process is described below. An inputted audio signal prior to a coding process is adjusted in gain, blocked for each predetermined number of samples and processed using each block as one frame. First, a psycho acoustic analysis section Fast Fourier Transforms (TFTs) the input frame to determine a frequency spectrum, calculates masking for the auditory sense based on the frequency spectrum, and determines permissible quantization noise power for each frequency band set in advance, and a parameter called Perceptual Entropy (PE) for the frame.

The perpetual entropy corresponds to a total bit number necessary to quantize the frame so that the listener may not perceive noise. Further, the perpetual entropy has a characteristic that it has a high value where the signal level increases suddenly like an attack portion of an audio signal. Therefore, the conversion block length in MDCT (Modified Discrete Cosine Transform) is determined based on a suddenly varying portion of the value of the perpetual entropy.

The MDCT process converts an audio signal inputted in a block length determined by the psycho acoustic analysis section into a frequency spectrum (hereinafter referred to as MDCT coefficients). A process (adaptive block changeover) of changing over the conversion block length adaptively in response to an input signal is necessary to suppress auditorily detrimental noise called pre-echo.

MDCT coefficients formed by the MDCT process are TNS (Temporal Noise Shaping) processed. The TNS process involves linear prediction comparing the MDCT coefficients to a signal on the time axis to perform predictive filtering for the MDCT coefficients. By this process, quantization noise elements included in a waveform obtained by inverse MDCT on the decoding side gather together at signals having high signal levels.

Then, the TNS processed MDCT coefficients are subject to intensity stereo coding, that, is, a process so that sound in a high frequency band can be transmitted by only one coupling channel including a left channel (L channel) and a right channel (R channel).

The intensity stereo coded MDCT coefficients are used such that, for each of the MDCT coefficients, the value of the MDCT coefficient at present is estimated from quantized MDCT coefficients in two frames in the past, and a predictive residual is determined. Then, it is determined whether or not an M/S stereo process should be performed for the predictive processed MDCT coefficients, that is, whether a sum signal (M=L+R) and a difference signal (S=L−R) of the left and right channels of the MDCT coefficients should, be transmitted or the signals of the left and right channels (L and R channels) should individually be transmitted. Then, the predictive processed MDCT coefficients are processed in the determined manner.

The M/S stereo processed MDCT coefficients are grouped (scaled) for each frequency band set in advance such that each group includes a plurality of MDCT coefficients, and quantization is performed in a unit of a group. A group of MDCT coefficients is called scale factor band. The scale factor bands are set in accordance with the characteristic of the auditory sense such that they are narrow on the low frequency side but are wide on the high frequency side.

In the quantization process, quantization is performed setting a target such that the MDCT coefficients are lower than a permissible quantization noise power for each scale factor band determined by the physical auditory sense section. The quantized MDCT coefficients are further subject to Huffman coding to reduce the redundancy thereof. The quantization and Huffman coding processes are executed in a repetition loop until the actually produced code amount becomes lower than the bit number allocated to the frame.

In this manner, according to the coding system for an audio signal of the AAC system, (1) a gain adjustment process→(2) an adaptive block length changeover MDCT process→(3) a TNS process→(4) an intensity stereo coding process→(5) a prediction process→(6) an M/S stereo process→(7) a scaling process are performed based on a result of a psycho acoustic analysis. Then, (8) a quantization process and (9) a Huffman coding process are repeated until after the bit number becomes smaller than an allocated bit number to form coded audio data. Then, various coefficients and so forth to be added in a processing procedure are added to the coded audio data to form a coded audio signal (AAC bit stream).

It is to be noted that an audio coding process of the AAC system is disclosed in detail in various documents such as, for example, Yutaka TAKATA and Satoshi ASAMI, "A guide to the television technique", Yoneda Shuppan, pp. 112 to 124 and also in Web pages and so forth.

Further, the gain adjustment process, TNS process, intensity stereo coding process, prediction process and M/S stereo process are optional processes but are not performed in all AAC coding processes. In other words, the gain adjustment process, TNS process, intensity stereo coding process, prediction process and M/S stereo process are performed only when, an option process is selected. In the embodiments described below, description is given taking a case wherein such an optical process as described above is performed to process a coded audio signal in a compression-coded state as an example.

[Processing Apparatus for a Compression Coded Digital Audio Signal]

Now, a digital signal processing apparatus (hereinafter referred to simply as processing apparatus) to which an embodiment of the present invention is applied is described. As described hereinabove, the processing apparatus of the present embodiment performs a decoding process of an audio signal coded in accordance with the AAC system.

In the processing apparatus according to the preferred embodiments of the present invention described below, signal components removed, cut or suppressed upon compression coding from within a digital audio signal formed by the compression coding, that is, missing signal components, are produced by prediction and added to improve the sound quality of the audio originating from the compression-coded digital audio signal. In the following, two preferred embodiments of the present invention, that is, first and second embodiments of the present, invention, between which the processing order is different, are described.

It is to be noted, that the processing apparatus of the first and second embodiments of the present invention are both applied typically to an audio recording and reproduction apparatus of the installed type or the portable type or an audio reproduction apparatus of the installed type or the portable type. In particular, the processing apparatus can be applied to hard disk players which use a hard disk as a recording medium, memory players which use a semiconductor memory as a recording medium, recording and reproduction apparatus or reproduction apparatus which use a magneto-optical disk such as an MD (Mini Disc® or an optical disk such as a DVD and various electronic apparatus such as personal computers which process a compression-coded, digital audio signal.

Further, in the processing apparatus of the first and second embodiments described below, the coded audio signal, that is, the digital audio signal, formed by coding in accordance with the AAC system is a 2ch (2-channel) audio signal formed by coding or compressing a 48 kHz sampling PCM signal at a bit rate of 128 kbps of an MPEG-2 AACLC profile.

First Embodiment

There is the possibility that, in a compression-coded digital, audio signal, not only audio signal components on the high frequency side may be cut or suppressed but also some audio signal components in the middle and low frequency regions may be removed, cut or suppressed. Therefore, in the processing apparatus of the first embodiment of the present invention described below, signal components which may possibly have been cut or suppressed by compression coding are first detected from existing digital audio signal components in the middle and low frequency regions formed by compression, coding. Then, from audio signal components having some correlation to the detected signal components, particularly from digital audio data of preceding and succeeding frames with respect to the detected signal components, audio data of those signal components which may possibly have been cut, that is, missing signals, are produced, that is, reconstructed, by prediction using a predictor, an approximate expression or an interpolation polynomial.

Then, if the predictively produced audio data are decided to be appropriate through comparison with information of a resolution or the like of preceding and succeeding audio signals within, the frame including the signal components detected as those signal components which may possibly have been cat or suppressed, then the produced audio data are added to the signal positions of the signal components which may possibly have been cut or suppressed. In this manner, an appropriate audio signal is added to each missing signal position in the middle and low frequency regions. Then, the existing audio signals and the audio data or missing signals produced by prediction and added are used to reconstruct high-frequency signal components.

In this manner, the processing apparatus of the first embodiment performs prediction and production of audio data at digital audio signal components which may possibly have been cut or suppressed from among digital audio signal components in the middle and low frequency regions. Then, the processing apparatus performs production and addition of audio data in a high frequency region using the digital audio data in the middle and low frequency regions including the thus produced audio data. In the following, the processing apparatus of the first embodiment is described in detail.

Figure 2:
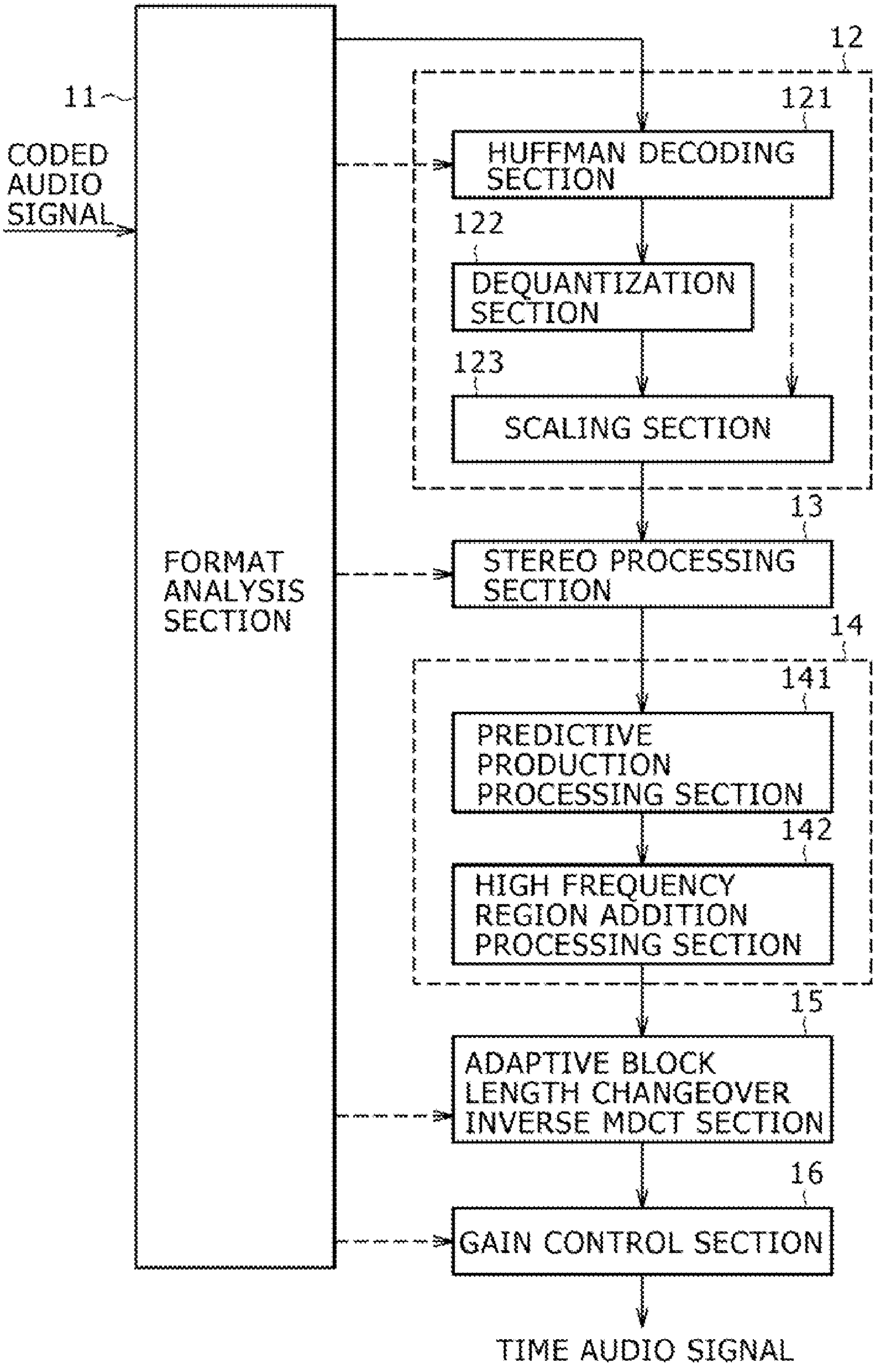
FIG. 2 is a block diagram showing a processing apparatus to which an embodiment of the present invention is applied.

Referring to FIG. 2, there is shown the processing apparatus according to the first embodiment of the present, invention. The processing apparatus shown performs a decoding process of a coded audio signal-formed by coding in accordance with the AAC system. The processing apparatus includes a format analysis section 11, a dequantization processing section 12, a stereo processing section 13, a missing signal reconstruction section 14, an adaptive block length changeover inverse MDCT section 15 and a gain control section 16 as principal components thereof.

The dequantisation processing section 12 includes a Huffman decoding section 121, a dequantisation section 122 and a rescaling section 123. Meanwhile, though not shown, the stereo processing section 13 includes an M/S stereo processing section, a prediction processing section, an intensity stereo processing section, and a TNS section. Further, the missing signal reconstruction section 14 includes a predictive production processing section 141 and a high frequency region addition section 142.

A coded audio signal of an object of decoding in the form of a bit stream is supplied to the format analysis section 11. The format analysis section 11 demultiplexes the coded audio signal supplied thereto into MDCT coefficients and other parameters and control information. The MDCT coefficients are supplied to the Huffman decoding section 121 of the dequantisation processing section 12.

Further, the format analysis section 11 forms control signals to foe supplied to the associated components of the processing apparatus based on the parameters and control information extracted from the bit stream of the coded audio signal. The format analysis section 11 supplies the control signals to the associated components of the processing apparatus as indicated by broken lines in FIG. 2 to control processing of the components.

Then, the decoding process of the coded audio signal is performed by performing reverse processing to that of the processing used upon AAC coding described hereinabove. In particular, since the MDCT coefficients demultiplexed by the format analysis section 11 are supplied to the Huffman decoding section 121 of the dequantization processing section 12 as described above, the Huffman decoding section 121 first performs a Huffman decoding process and then the dequantization section 122 performs a dequantization process, whereafter the rescaling section 123 performs a rescaling process to reconstruct MDCT coefficients same as those prior to quantization.

Then, the MDCT coefficients reconstructed so as to be same as those prior to quantization are supplied to the stereo processing section 13. Though not shown, the stereo processing section 13 includes such components as the M/S stereo processing section, prediction processing section, intensity stereo processing section and TMS section as described hereinabove. The M/S stereo processing section reconstructs MDCT coefficients of the left channel (Lch) and the right channel (Rch), and the prediction processing section performs a prediction process to reconstruct MDCT coefficients same as those prior to the data compression.

The MDCT coefficients reconstructed so as to be same as those prior to the data compression are further subject to an intensity stereo decoding process by the intensify stereo processing section so that MDCT coefficients of the left and right channels are distributed also to sound in the high frequency region. Further, the TNS section removes an effect of prediction filtering to reconstruct those MDCT coefficients same as those in a state immediately after the MDCT process upon coding.

Figure 3A:
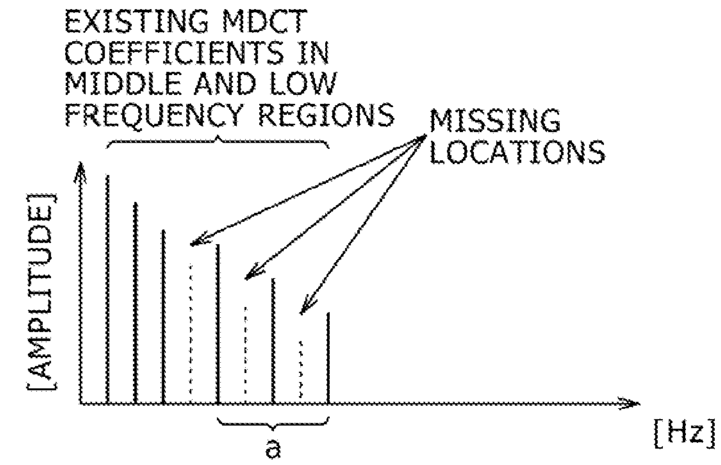
FIGS. 3A, 3B and 3C are diagrammatic views illustrating a process executed by a missing signal reconstruction section of the processing apparatus and particularly illustrating MDCT coefficients taking the frequency and the amplitude as an axis of abscissa and an axis of ordinate, respectively.
Figure 3B:
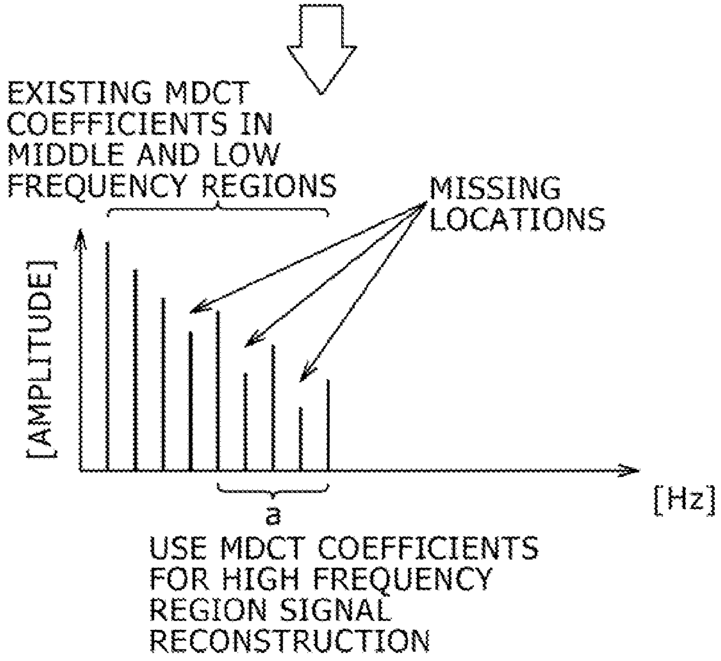
Figure 3C:
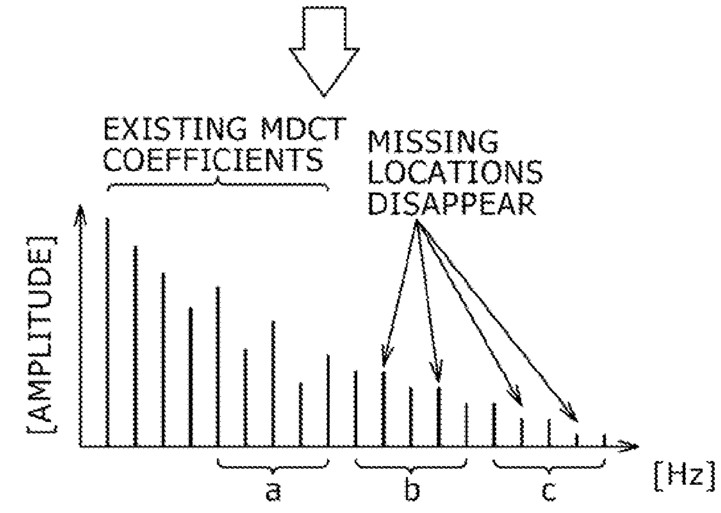
Figure 4A:
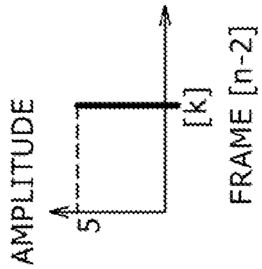
FIGS. 4A to 4E are diagrammatic views illustrating a digital audio signal compression-coded by the AAC system and including a missing signal component at an MDCT coefficient of a frame.
Figure 4B:
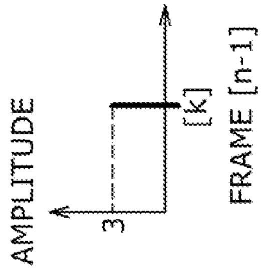
Figure 4C:
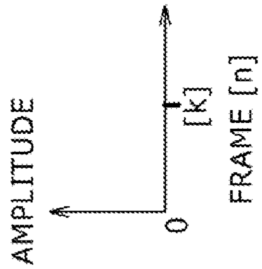
Figure 4D:
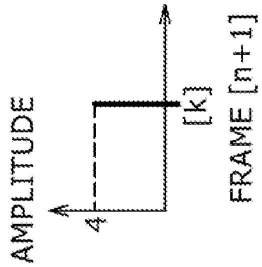
Figure 4E:
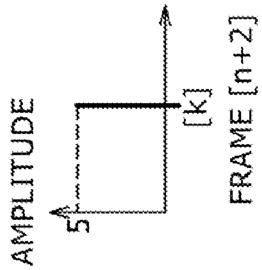

Then, the MDCT coefficients are supplied from the stereo processing section 13 to the predictive production processing section 141 of the missing signal reconstruction section 14. FIGS. 3A to 3C illustrate the process performed by the missing signal reconstruction section 14 and illustrates a state of the MDCT coefficients taking the frequency as the axis of abscissa and taking the amplitude as the axis of ordinate.

The MDCT coefficients supplied to the predictive production processing section 141 of the missing signal reconstruction section 14 have been formed by a compression coding process and belong to the middle and low frequency regions as seen in FIG. 3A. As seen in FIG. 3A, the MDCT coefficients are cut or suppressed in the high frequency region and also at those signal components which have a comparatively small influence on the auditory sense of the user as indicated by broken lines in FIG. 3A.

Therefore, the predictive production processing section 141 detects, based on the MDCT coefficients supplied thereto, those MDCT coefficients which may possibly have been cut or suppressed upon compression coding. In particular, those MDCT coefficients whose value is zero are detected. Then, the values of the MDCT coefficients which may possibly have been cut or suppressed are determined by prediction based on corresponding MDCT coefficients in preceding and succeeding frames to the frame which includes the MDCT coefficients. This process corresponds to a predictive production process of audio data which may possibly have been cut or suppressed.

Then, if the MDCT coefficients produced by the prediction are lower than the resolution at the MDCT coefficients whose value is zero, then the predictive production processing section 141 adopts the MDCT coefficients produced by the prediction as interpolation data. However, if the MDCT coefficients produced by the prediction are equal to or higher than the resolution, then since it is originally inappropriate that the MDCT coefficients of such values are cut or suppressed, the predictive production processing section 141 decides that the prediction has been performed but in failure. Therefore, the predictive production processing section 141 does not adopt the MDCT coefficients produced by the prediction.

In this manner, where MDCT coefficients which may possibly have been cut or suppressed are produced by prediction and are lower than the resolution, the MDCT coefficients are used as interpolation data such that MDCT coefficients in the middle and low frequency regions, that is, MDCT coefficients or audio data in a modulation frequency band, which include MDCT coefficients interpolated at the signal positions of the MDCT coefficients cut or suppressed as seen in FIG. 3B because they are lower than the resolution, can be produced.

The MDCT coefficients in the middle and low frequency regions interpolated at the signal positions of the MDCT coefficients which may possibly have been cut or suppressed in this manner are supplied to the high frequency region addition section 142 of the missing signal reconstruction section 14. The high frequency region addition section 142 uses, for example, those MDCT coefficients in a range a indicated in FIG. 3A from among the MDCT coefficients in the middle and low frequency regions shown in FIG. 3B to reconstruct the MDCT coefficients on the high frequency side which were cut upon compression coding.

Figure 1A:
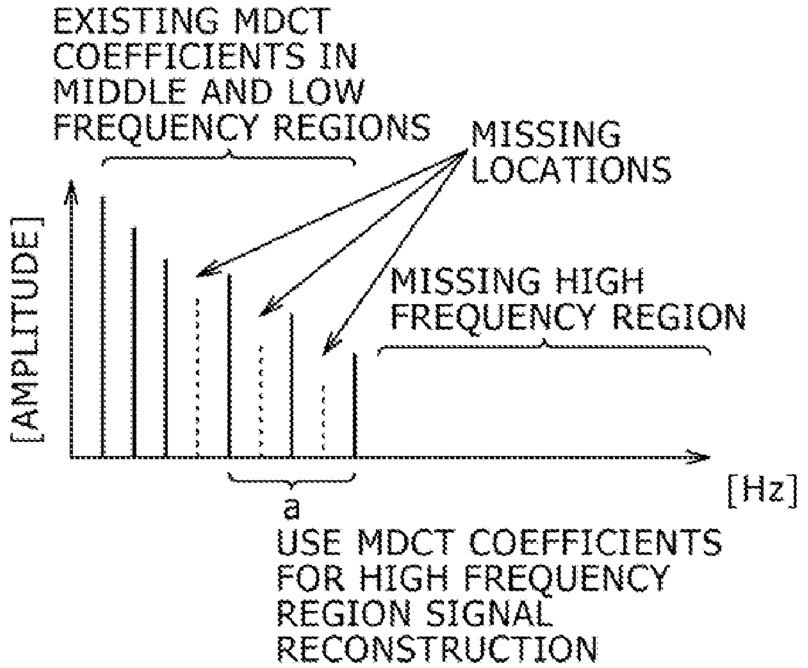
FIGS. 1A and 1B are diagrammatic views illustrating reconstruction of a high frequency signal using an existing audio signal.
Figure 1B:
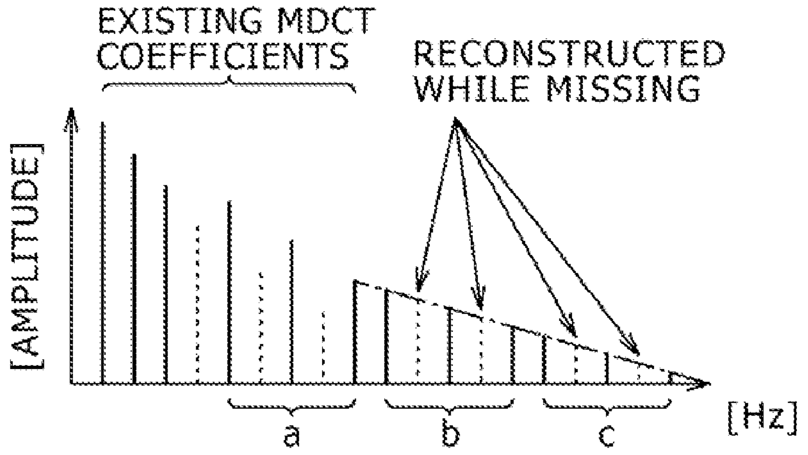

In FIG. 3A, it is shown that the range a includes those MDCT coefficients which may possibly have been cut or suppressed upon coding as indicated by broken lines. However, those MDCT coefficients within the range a which may possibly have been cut or suppressed upon coding are interpolated as seen in FIG. 3B by the function of the predictive production processing section 141. Therefore, if the MDCT coefficients within the range a are used to reconstruct the MDCT coefficients on the high frequency side which were cut or suppressed in the compression coding process, then the MDCT coefficients in the cut or suppressed frequency band can be reconstructed with a high degree of reliability as seen in ranges b and c in FIG. 3C. Thus, the MDCT coefficients which may possibly have been cut as described above with reference to FIG. 1 do not remain as they are in the MDCT coefficients illustrated in FIG. 3C.

Thereafter, the MDCT coefficients including those reconstructed in the high frequency region as seen in FIG. 3C are supplied from the high frequency region addition section 142 to the adaptive block length changeover inverse MDCT section 15. The adaptive block length changeover inverse MDCT section 15 inverse MDCT processes the MDCT coefficients supplied thereto in the form of audio signal components in the frequency domain into audio signals in the time axis domain. Then, the adaptive block length changeover inverse MDCT section 15 supplies the audio signals to the gain control section 16, by which the gain of the audio signals is adjusted to reconstruct the original audio signal in the time axis domain same as that prior to the coding, that is, a time audio signal. The time audio signal is outputted from the gain control section 16. Thus, the coded audio signal supplied to the adaptive block length changeover inverse MDCT section 15 is an audio signal in the frequency domain, and the audio signal outputted from the adaptive block length changeover inverse MDCT section 15 is an audio signal in the time axis domain, that is, a time audio signal.

In this manner, in the processing apparatus of the first embodiment, detection of audio signal components which may possibly have been cut or suppressed from among coded audio signal components in the middle and low frequency regions and prediction and production of audio data at the detected audio signal components are performed first. Then, the coded audio signal components, that is, digital, audio signal components, in the middle and low frequency regions including the produced audio data are used for production and addition of audio data in the high frequency region. By the processes, the digital audio signal of high, quality in a state prior to compression coding can be reconstructed from coded audio signal components, that is, compression-coded digital audio signal components.

Where the digital audio signal reconstructed so as to be same as that prior to the compression coding is reproduced, since missing signal components cut by the compression coding are reduced when compared with those where digital audio signal components reproduced using a system in related art are reproduced. Therefore, audio of high sound quality can be reproduced.

[Details of the Process by the Predictive Production Processing Section 141]

Now, details of the process executed by the predictive production processing section 141 of the missing signal reconstruction section 14 in the processing apparatus of the present first embodiment are described with reference to FIGS. 4A to 7. In the processing apparatus of the first embodiment, a prediction method which uses the least squares method to produce an approximate expression is used as a prediction method for those missing signals which may possibly have been cut upon compression coding.

As described hereinabove, the compression coding system: used is the MPEG-2 AAC system and performs orthogonal transform for each one frame including 1,024 samples to obtain 1,024 MDCT coefficients. An AAC coded signal is formed by compressing the MDCT coefficients in a unit of one frame. The MDCT coefficients are handled as signals in the frequency domain, and the 0th to 1,023th MDCT coefficients in one frame correspond to audio signal components of the frequency regions 0 to 24 Hz (because an audio signal by 48 Hz sampling is used). The axis of ordinate indicates the amplitude.

For example, the coefficient value of the 100th MDCT coefficient represents an audio signal at 24,000 Hz/1, 024*100=2,343.75 Hz. Since the distribution of MDCT coefficients represents frequency regions, preceding and succeeding frames or preceding and succeeding MDCT coefficients within one frame have a correlation.

Here, in order to facilitate description, a method of predicting an MDCT coefficient [k] of a frame [n] using an appropriate expression is described taking a case wherein, where audio data of certain music are compression-coded, in accordance with the AAC system, the kth MDCT coefficient (MDCT coefficient [k]) of the nth frame (frame [n]) becomes the value "0" as a result of a compression process, that is, becomes a missing coefficient, as an example.

FIGS. 4A to 4E illustrate a concept of a case wherein the MDCT coefficient [k] of the frame [n] misses in a digital audio signal compression-coded in accordance with the AAC system. In FIGS. 4A to 4E, a case is illustrated wherein, while an MDCT coefficient [k] in each of preceding two frames and succeeding two frames (FIGS. 4A, 4B, 4D and 4E) to the frame [n] of FIG. 4C, the MDCT coefficient [k] of the frame [n] has the value "0" and is missing.

Where the MDCT coefficient has the value "0", there is the possibility that the original audio signal component may have been cut upon the compression coding process and may be missing. In the processing apparatus of the present first embodiment, the predictive production processing section 141 of the missing signal reconstruction section 14 first detects those DCT coefficients whose value is "0" and may have been cut upon compression coding with a high degree of possibility, and predicts and reconstructs the MDCT coefficients at the locations.

Figure 5:
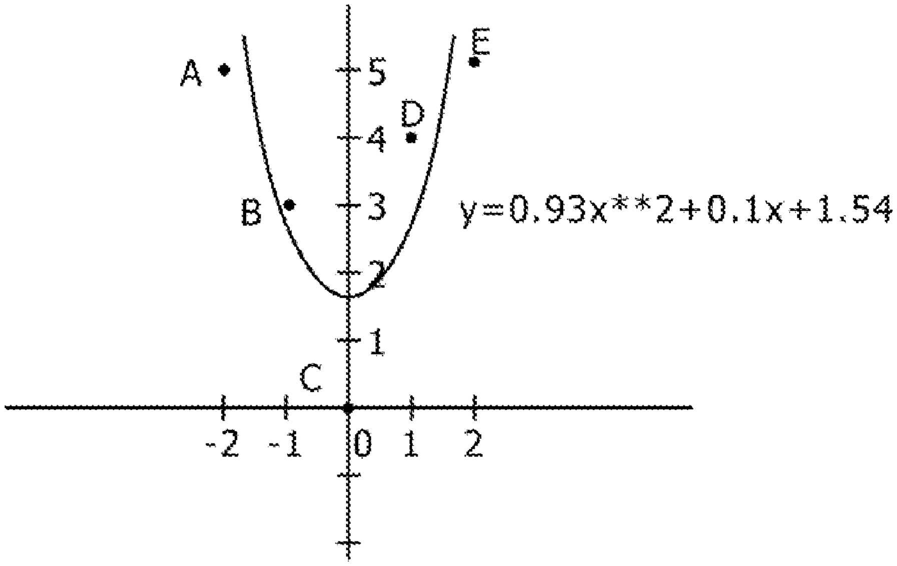
FIG. 5 is a diagram illustrating representation of MDCT coefficients of five frames shown in FIG. 4 on a two-dimensional coordinate system to produce an approximate expression.

FIG. 5 illustrates a case wherein the MDCT coefficients [k] of the five frames illustrated in FIGS. 4A to 4E are represented on a two-dimensional coordinate system: to produce an approximate expression. It is assumed that the MDCT coefficients [k] of the two preceding frames and the two succeeding frames to the frame [n] which correspond to the MDCT coefficient [k] of the frame [n] are acquired. Further, the MDCT coefficient [k] of the frame [n−2] is represented by A, the MDCT coefficient [k] of the frame [n−1] by B, the MDCT coefficient [k] of the frame [n] by C, the MDCT coefficient [k] of the frame [n+1] by D, and the MDCT coefficient [k] of the frame [n+2] by E.

The five points A to E represent signals at the same frequency position within the five successive frames. A two-dimensional polynomial by the least squares method at the five points is produced and used as an approximate expression. It is assumed that the amplitude C=0 is known while the other amplitudes A, B, D and E are A=5, B=3, D=4 and E=5, respectively, as seen in FIGS. 4A to 4E. Thus, the signals A to E are compared to coordinates of the five successive points and set to A=(−2, 5), B=(−1, 3), C=(0, 0), D=(1, 4) and E=(2, 5). Then, the least squares method is used to determine an approximate expression.

From the determined approximate expression, a predictive value of the value of the MDCT coefficient [k] of the frame [n], that is, of C, is determined. Here, as seen also in FIG. 5, the approximate expression is y=0.93x2+0.1x+1.54. By determining the predictive value (predicted MDCT coefficient) of the point C from the approximate expression, C≈1.54 is obtained. It is to be noted that "x2" in the approximate expression signifies the square of x.

Figure 6:
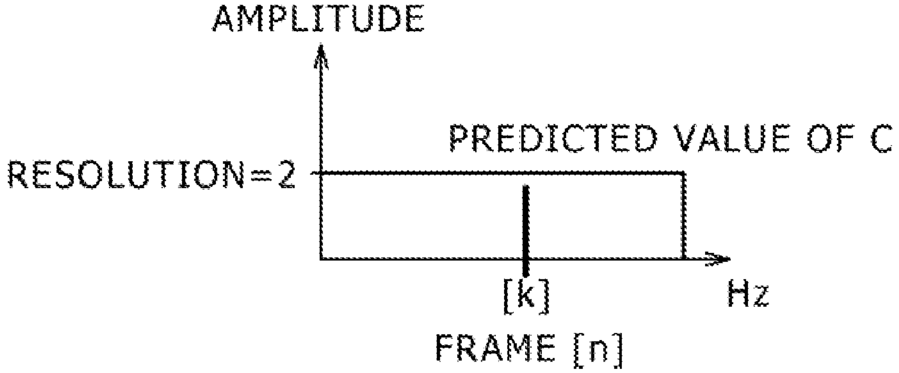
FIG. 6 is a diagrammatic view illustrating a relationship between a resolution and a predicted value of an MDCT coefficient of a frame.

Then, if is examined whether or not the predictive value, that is, the predicted MDCT coefficient, of the point C is appropriate. FIG. 6 illustrates a relationship between the resolution and the predictive value of the MDCT coefficient [k] of the frame [n]. In the present first embodiment, where the absolute value of the predictive value determined in such a manner as described above is lower than the resolution at the MDCT coefficient [k] of the frame [n], the predictive value is adopted as the MDCT coefficient [k] of the frame [n]. In other words, the predictive value is adopted as an audio signal for the MDCT coefficient [k] of the frame [n].

On the other hand, if the absolute value of the predictive value determined in such a manner as described, above is equal to or higher than the resolution, then it is determined that the prediction has resulted in failure, and the predictive value is not adopted as an audio signal. In particular, that an MDCT coefficient is cut or suppressed upon compression coding signifies that it has a value lower than the resolution, and since, where the MDCT coefficient has a value equal to or higher than the resolution, this is by no means cut or suppressed, the state that the MDCT coefficient is missing is maintained.

Here, if it is assumed that the resolution at the MDCT coefficient [k] of the frame [n] is two as seen in FIG. 6, then since the prediction value C=1.54 is lower than two, it is adopted as the kth MDCT coefficient of the frame [n]. As described hereinabove, that an audio signal is missing signifies that the amplitude of the original audio signal is lower than the resolution, and therefore the audio signal may not be represented with the established resolution but has the value zero. Therefore, it is theoretically correct to adopt a predictive value which is lower than the resolution without fail.

In this manner, in the processing apparatus of the present first embodiment, the predictive production processing section 141 of the missing signal reconstruction section 14 performs a process of detecting, for each frame, signal components which may possibly have been cut or suppressed upon compression coding and then predicting and producing an MDCT coefficient as each of the missing signals which may possibly have been cut or suppressed.

Figure 7:
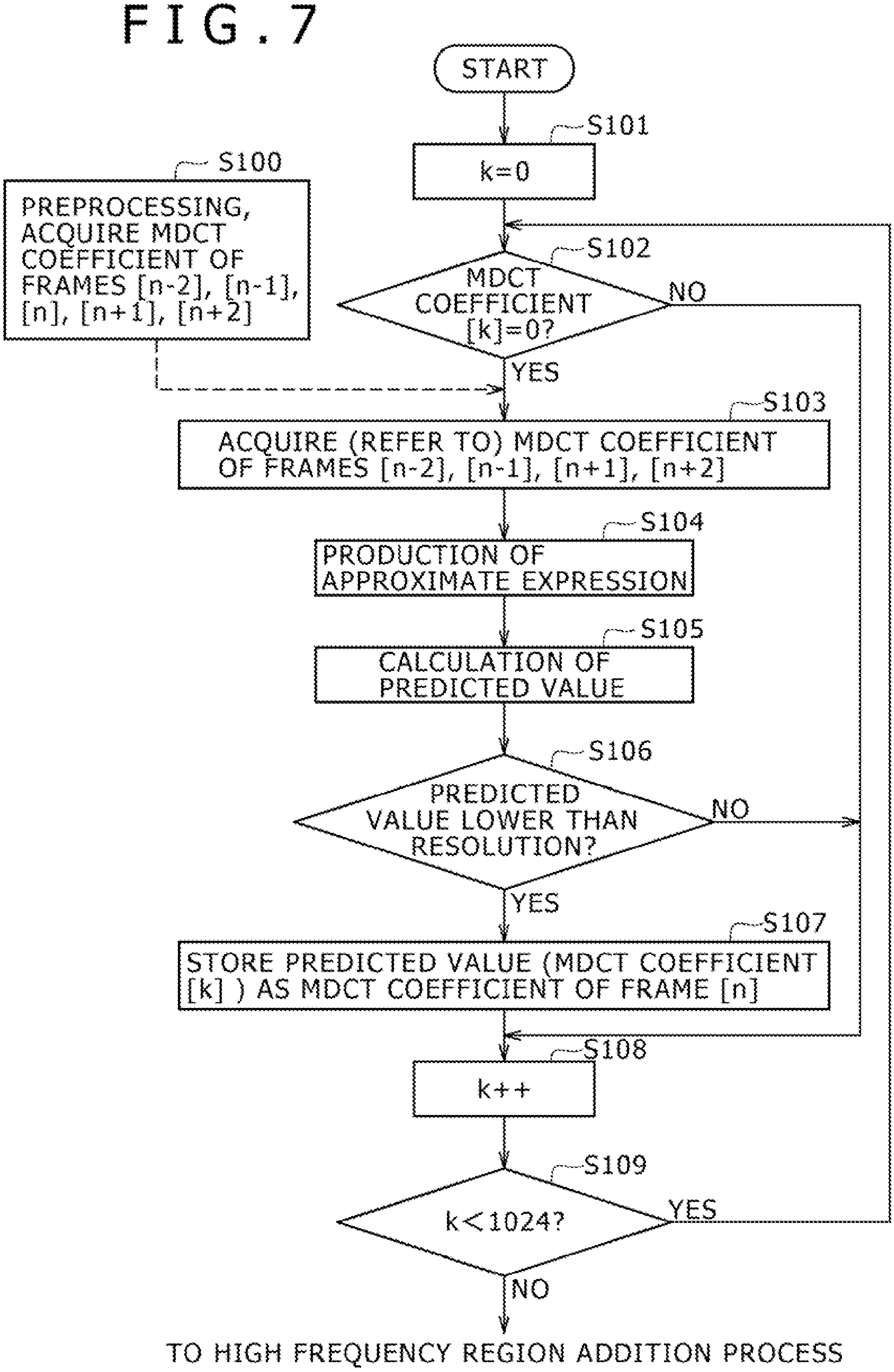
FIG. 7 is a flow chart illustrating a predictive production process executed by a predictive production processing section.

Now, the predictive production process performed by the predictive production processing section 141 of the missing signal reconstruction section 14 of the processing apparatus according to the first embodiment is described with reference to FIG. 7. FIG. 7 is a flow chart illustrating the predictive production process performed by the predictive production processing section 141.

First, a process of detecting, for each frame, those MDCT coefficients which may possibly have been cut or suppressed upon compression coding and then predicting the values of correcting MDCT coefficients of two preceding frames and two succeeding frames to the detected MDCT coefficients which may possibly have been cut or suppressed as described hereinabove with reference to FIGS. 4A to 6 is described. In other words, the predictive production process used in the present first embodiment normally predicts the third frame (frame [n]) in the middle of the five successive frames while positioning the MDCT coefficients, which may possibly have been cut or suppressed, in the third frame (frame [n]).

As seen in FIG. 7, in the present first, embodiment, setting a frame which makes an object of processing as frame [n], all of the 0th to the 1,023th MDCT coefficients for two preceding frames and two succeeding frames are acquired in advance as pre-processing (step S100). In other words, where the frame of the search object for cut or suppressed MDCT coefficients is set as frame [n], a process of acquiring the MDCT coefficients of the five frames (frame [n−2], frame [n−1], frame [n], frame [n+1] and frame [n+2]) in advance is executed at step S100 illustrated in FIG. 7. Then, a process of detecting those MDCT coefficients whose value is zero from among the 0th to 1,023th MDCT coefficients which compose the frame [n].

In particular, the predictive production processing section 141 first substitutes the value zero into a variable k to initialize the variable k (step 3101). Then, the predictive production processing section 141 decides whether or not the value of the MDCT coefficient [k] is zero (step S102). If it is decided by the decision process at step S102 that the value of the MDCT coefficient [k] is zero, then since there is the possibility that the MDCT coefficient [k] may possibly have been cut or suppressed upon compression coding and may be missing, the predictive production processing section 141 acquires the MDCT coefficients [k] at the corresponding frequency position in the two preceding frames and the two succeeding frames acquired in advance at step S100 as described hereinabove (step S103).

Then, the predictive production processing section 141 uses the MDCT coefficients at the five points including the MDCT coefficient [k] of the pertaining frame (frame [n]) and the corresponding MDCT coefficients [k] in the two preceding frames and the two succeeding frames to produce an approximate expression by the least squares method as described hereinabove with, reference to FIG. 5 (step S104).

Then, the predictive production processing section 141 predictively produces the value of the MDCT coefficient [k] in the frame [n] based on the approximate expression produced at step S104 (step S105). Then, the predictive production processing section 141 decides whether or not the MDCT coefficient [k] produced by the prediction at step S105 is lower than the resolution at the frequency position of the prediction (step S106).

If it is decided by the decision process at step S106 that the MDCT coefficient [k] produced by the prediction is lower than the resolution, then the predictive production processing section 141 adopts and records the MDCT coefficient [k] produced by prediction at step S105 as the value of the MDCT coefficient [k] of the frame [n] (step S107).

Then, the predictive production processing section 141 increments the variable k by one (step S108) and decides whether or not the variable k is lower than 1,024 (step S109). If it is decided by the decision process at step S109 that the variable k is lower than 1,024, then since the process for all of the MDCT coefficients of the frame [n] of the processing object is not completed as yet, the predictive production processing section 141 repeats the processes at the steps beginning with step S102.

On the other hand, if it is decided by the decision process at step S109 that the variable k is not smaller than 1,024, then since the process for an object of all of the MDCT coefficients of the frame [n] of the processing object is ended, a high frequency region addition process is executed for the frame [n]. Then, the process described above with reference to FIG. 7 is executed for all frames of the compression-coded digital audio signal of the processing object of reproduction or the Like to reconstruct the audio signal components cut, or suppressed by compression coding for the entire digital audio signal so that the audio signal components can be utilized.

[Details of the Process by the High Frequency Region Addition Section 142]

Figure 8:
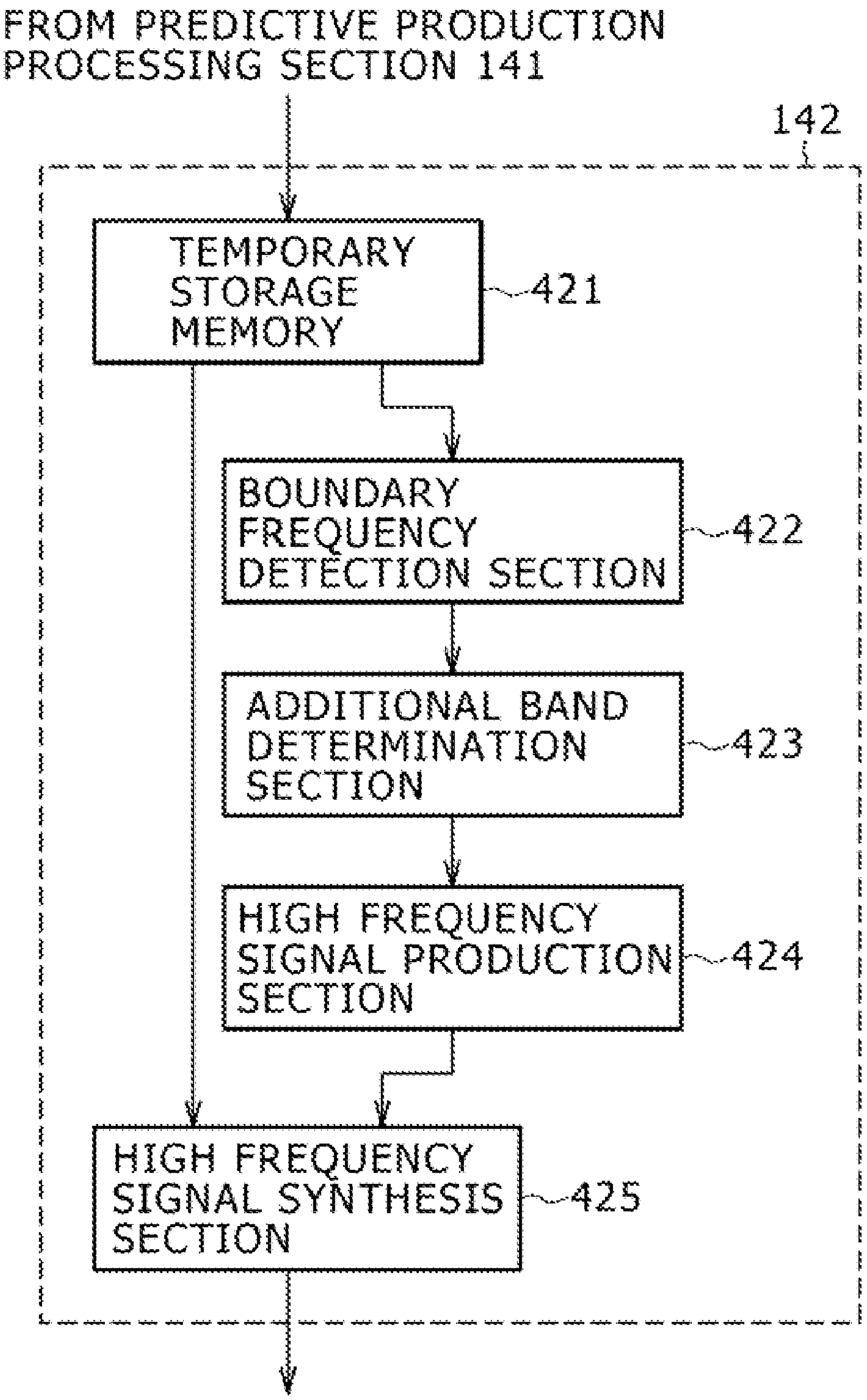

How, the high frequency region addition process executed by the high frequency region addition section 142 is described. FIG. 3 illustrates an example of a configuration of the high frequency region addition section 142 of the processing apparatus of the first, embodiment. Referring to FIG. 8, the high frequency region addition section 142 shown includes a temporary storage memory 421, a boundary frequency detection section 422, an additional band determination section 423, a high frequency signal production section 424 and a high frequency signal synthesis section 425.

As described hereinabove, from among the MDCT coefficients produced as MDCT coefficients, which may possibly have been cut or suppressed, by prediction by the predictive production processing section 141, those MDCT coefficients in the middle and low frequency regions which are lower than the resolution and are to be added are temporarily stored in a unit of a frame into the high frequency region addition section 142.

The boundary frequency detection section 422 successively reads out the MDCT coefficients temporarily stored in a unit of a frame in the temporary storage memory 421 and detects a boundary frequency (lower limit side boundary frequency) beyond which all of the MDCT coefficients in the entire high frequency region are out or suppressed. Generally, the boundary frequency frequently relies upon the bit rate. Although the specifications in coding are not uniform because they depend upon the technical capability of the encoder maker, there is a tendency that, for example, where a bit rate of 196 kbps is used for coding (encoding), the boundary frequency is in the proximity of 20 kHz, but where another bit rate of 123 kbps is used for encoding, the boundary frequency is in the proximity of 16 kHz, and where a further bit rate of 64 kbps is used, the boundary frequency is in the proximity of 14 kHz.

In the processing apparatus of the present embodiment, since the coded audio signal of an object of signal processing is obtained by compression coding at a bit rate of 128 kbps, it can be detected or specified that the boundary frequency is approximately 16 kHz. In other words, the coded audio signal to be decoded by the processing apparatus of the present embodiment can be specified as an audio signal in a high frequency region of approximately 16 kHz or more which has been cut or suppressed and then deteriorated.

The additional band determination section 423 determines a bandwidth within which high frequency signal components are to be added in a high frequency region higher than the boundary frequency. In the present embodiment, high frequency signal components are added in the overall frequency region higher than the boundary frequency where the boundary frequency is equal to or higher than 15 kHz. It is to foe noted that, while the value of 15 kHz is used in the present embodiment, it is possible to lower the condition for the frequency band for addition to approximately 14 kHz. However, if the boundary band is lowered to a value in the proximity of 10 kHz, then since there is the possibility that the added signals may be felt as noise, it is not preferable to lower the condition for the frequency band for addition to a value in the proximity of 10 kHz.

In the first embodiment, the boundary frequency detected by the boundary frequency detection section 422 is 16 kHz as described hereinabove and satisfies the predetermined condition of "the boundary frequency is higher than 15 kHz", the additional band determination section 423 adds high frequency band signals (coded audio signals in a high frequency region) higher than 16 kHz. Further, in the first embodiment, an audio signal by 48 kHz sampling is used as described hereinabove, the frequency at the upper limit for addition is determined to be 24 kHz which is one half the sampling frequency. Therefore, the band for addition for high frequency signal components in the present first embodiment is set to the range from 16 kHz to 24 kHz.

The high frequency signal production section 424 produces high frequency signal components to be added by calculation. The high frequency signal production section 424 uses the technique disclosed, for example, in Japanese Patent No. 3,646,657, “Device and method for digital signal processing as well as One-bit signal-production device” to produce high frequency signal components (MDCT coefficients) to be added.

In particular, the boundary frequency detection section 422 calculates a frequency characteristic gradient from the amplitude value of the signal at the boundary frequency determined by the boundary frequency detection section 422 setting the amplitude value of the signal at the upper limit frequency (in the present embodiment, 24 kHz) to zero (0). Then, in the first embodiment, the lower limit frequency is set to 10.5 kHz, and signals within a range from 10.5 kHz to the lower limit side boundary frequency (in the present first embodiment, 16 kHz) are buffered. Then, the boundary frequency detection section 422 performs spectrum duplication, gain calculation and gain adjustment processes to produce high frequency signal components (MDCT coefficients) to foe added.

The high frequency signal components produced by the high frequency signal production section 424 are supplied, to the high frequency signal synthesis section 425. The high frequency signal synthesis section 425 reads out the MDCT coefficients in the middle and low frequency regions from the temporary storage memory 421 and synthesizes the high, frequency signal components from the high frequency signal production section 424 with the read out MDCT coefficients to reconstruct a digital audio signal in a compression-coded state wherein MDCT coefficients in all of the low, middle and high frequency regions are settled.

The reconstructed digital audio signal is supplied to the adaptive block length changeover inverse MDCT section 15 as described hereinabove with reference to FIG. 2. Thus, the digital audio signal is inverse MDCT transformed back into an audio signal in the time domain and is then subject to gain adjustment by the adaptive block length changeover inverse MDCT section 15. Consequently, audio signal components which may possibly have been cut or suppressed upon compression coding can be reconstructed with a high degree of accuracy, and accordingly, when the digital audio signal including the reconstructed audio signal components is reproduced, audio data of high sound quality can be reconstructed.

Modification to the First Embodiment

The processing apparatus of the first embodiment includes the missing signal reconstruction section 14 including the predictive production processing section 141 and the high frequency region addition section 142 between the stereo processing section 13 and the adaptive block length changeover inverse MDCT section 15 as seen in FIG. 2. In particular, the missing signal reconstruction section 14 is provided in the inside of a decoder which reconstructs a compression-coded digital-audio signal into an audio signal in the time domain. By the configuration, those audio signal components which have been cut or suppressed can be reconstructed suitably in accordance with an object compression coding system, in the present embodiment, in accordance with, a decoding process conforming to the AAC system.

However, various compression coding systems are available. Therefore, it is possible to provide the missing signal reconstruction section 14 outside the decoder as seen in FIG. 9 so that audio signal components which may possibly have been cut or suppressed upon compression coding are reconstructed independently of the compression coding system to improve the sound quality of the reproduced audio. In particular, FIG. 9 shows the modified form of the processing apparatus of the first embodiment.

Referring to FIG. 9, a format analysis section 11, a dequantization processing section 12, a stereo processing section 13, an adaptive block length changeover inverse MDCT section 15, a gain control section 16 and a missing signal reconstruction section 14 are configured similarly to those of the processing apparatus described hereinabove with reference to FIG. 2. Therefore, detailed description of the format analysis section 11, dequantization processing section 12, stereo processing section 13, adaptive block length changeover inverse MDCT section 15, gain control section 16 and missing signal reconstruction section 14 is omitted herein to avoid redundancy.

In the modified processing apparatus shown in FIG. 9, an audio signal outputted from the gain control section 16 already has a form of an audio signal in the time axis domain, that is, a form of a time audio signal. Therefore, an MDCT section 17 is provided such that it MDCT transforms the time audio signal from the gain control section 16 into MDCT coefficients which are audio signal components in the frequency domain again. Then, the MDCT coefficients are supplied to the missing signal reconstruction section 14 provided at the next stage to the MDCT section 17.

The missing signal reconstruction section 14 is configured similarly to the missing signal reconstruction section 14 used in the processing apparatus shown in FIG. 2. In particular, the missing signal reconstruction section 14 first uses, for each frame, existing MDCT coefficients in the middle and low frequency regions to detect signal positions at which the signal may possibly have been cut or suppressed upon compression coding and predict and produce MDCT coefficients (audio signal components) at the signal positions. Then, if the produced MDCT coefficients are appropriate in view of the resolution, the missing signal reconstruction section 14 adopts the produced MDCT coefficients as MDCT coefficients in the middle and low frequency regions.

The high frequency region addition section 142 uses the MDCT coefficients in the middle and low frequency regions, to which also the audio signal components which may possibly have been cut or suppressed in the middle and low frequency regions are added, to reconstruct and add MDCT coefficients in the high frequency region in such a manner as described hereinabove with reference to FIG. 3. Consequently, also the MDCT coefficients in the high frequency region which have been cut or suppressed, upon compression coding are reconstructed, and a digital audio signal which includes full MDCT coefficients in all frequency bands including the low, middle and high frequency band can be reconstructed.

Then, the MDCT coefficients in all of the low, middle and high frequency bands from the high frequency region addition section 142 are supplied to an inverse MDCT section 18, by which they are inverse MDCT transformed back into audio signal components in the time axis domain which can be utilized. In this manner, also where the missing signal reconstruction section 14 is provided outside the decoder, the present invention can be applied, and it is possible to reconstruct, in all frequency bands, audio signal components which may possibly have been cut or suppressed upon the compression coding process. Consequently, it is possible to reproduce the audio having good sound quality.

Second Embodiment

Now, a second embodiment of the present invention is described. The processing apparatus of the second embodiment described below is generally configured such that it first performs a "thigh frequency region addition process" and then performs a "predictive production process". In particular, high frequency signal components are first, reconstructed, using existing compression-coded audio signal components in the middle and low frequency regions. Then, in all frequency bands of the frequency domain, missing signals in the current frame are predicted and produced from audio signal components in preceding and succeeding frames using a predictor, an approximate expression, an interpolation polynomial or the like.

If the missing signals (audio signal components) produced by prediction are determined to be appropriate through comparison thereof with information of the resolution or the like which preceding and succeeding audio signal components in the current frame have, then the missing signals are added to the missing signal positions. The processing apparatus of the second embodiment described below performs a process of adding appropriate audio signal components at missing positions in the overall frequency bands.

FIG. 10 shows the processing apparatus of the present second embodiment.

Referring to FIG. 10, the processing apparatus of the second embodiment shown includes a format analysis section 11, a dequantisation processing section 12, a stereo processing section 13, an adaptive block length changeover inverse MDCT section 15 and a gain control section 16 configured similarly to those of the processing apparatus of the first embodiment described hereinabove with reference to FIG. 2.

However, the processing apparatus of the second embodiment includes a missing signal reconstruction section 19 being different from the missing signal reconstruction section 14 in the processing apparatus of the first embodiment described hereinabove with reference to FIG. 2. The missing signal reconstruction section 19 is provided between the stereo processing section 13 and the adaptive block length changeover inverse MDCT section 15 and includes a high frequency region addition processing section 191 provided at a preceding stage and predictive production processing section 192 provided at a succeeding stage. In particular, while the missing signal reconstruction section 14 in the processing apparatus of the first, embodiment includes the predictive production processing section 141 and the high frequency region addition section 142 provided in this order, the missing signal reconstruction section 19 in the processing apparatus of the second embodiment includes the high frequency region addition processing section 191 and predictive production processing section 192 provided in this order, that is, in the reverse order to that of the predictive production processing section 141 and the high frequency region addition section 142.

In the missing signal reconstruction section 19 of the processing apparatus of the second embodiment, MDCT coefficients in the high frequency region are reconstructed first by a function of the high frequency region addition processing section 191. Then, for all of the low, middle and high frequency bands including the high frequency band within which the MDCT coefficients are reconstructed already, signal positions (MDCT coefficients) at which a signal may possibly have been cut or suppressed upon compression coding are specified and signal components at the signal positions are reconstructed by a function of the predictive production processing section 192. Consequently, compression-coded audio signal components of the processing object in the overall frequency bands can be reconstructed, with high quality.

FIGS. 11A to 11C illustrate the process executed by the missing signal reconstruction section 19 of the processing apparatus of the second embodiment. As seen in FIG. 11A, MDCT coefficients supplied to the high frequency region addition processing section 191 of the missing signal reconstruction section 19 in the processing apparatus of the second embodiment, have been formed by a compression coding process and are included in the middle and low frequency regions while high frequency components are cut or suppressed. Besides, also signal components at signal positions which have a less significant influence on the auditory sense of the user are cut or suppressed as indicated by broken lines in FIG. 11A.

Therefore, in the processing apparatus of the second embodiment, high frequency signal components illustrated in a range b and another range c are reconstructed as seen in FIG. 11B based on the MDCT coefficients within a range illustrated, in FIG. 11A using a function of the high frequency region addition processing section 191. The high frequency region addition processing section 191 has a configuration similar to that of the high frequency region addition section 142 of the processing apparatus of the first embodiment described hereinabove with reference to FIG. 8.

Accordingly, in the high frequency region addition processing section 191, similarly as in the high frequency region addition section 142 of the processing apparatus of the first described hereinabove with reference to FIG. 8, MDCT coefficients are retained in a temporary storage memory in a unit of a frame, and a boundary frequency is detected, and then a frequency band for addition is determined. Further, high frequency signal components are produced in response to the frequency band for addition, and finally, the temporarily stored MDCT coefficients in the middle and low frequency regions and the reconstructed MDCT coefficients in the high frequency region are synthesised thereby to reconstruct the MDCT coefficients in all of the low, middle and high frequency regions as seen in FIG. 11B.

However, the MDCT coefficients formed by and outputted from the high frequency region addition processing section 191 of the processing apparatus shown in FIG. 10 remain in a state wherein signal positions at which signal components which may possibly have been cut or suppressed upon compression coding are included in the MDCT coefficients. Therefore, in the processing apparatus of the second embodiment, the predictive production processing section 192 of the missing signal reconstruction section 19 reconstructs the signal components at the signal positions at which the signal components may possibly have been cut or suppressed upon compression coding.

In particular, the predictive production processing section 192 of the processing apparatus of the second embodiment has a function similar to that of the predictive production processing section 141 of the processing apparatus of the first embodiment, described hereinabove with reference to FIGS. 4A to 7. More particularly, the predictive production processing section 192 receives MDCT coefficients supplied from the high frequency region addition processing section 191 and detects signal, positions at which signal components may possibly have been cut or suppressed upon compression coding in a unit of a frame. Then, the predictive production processing section 192 produces an approximate expression using the MDCT coefficients at corresponding positions of five frames including the frame of the processing object and two preceding frames and two succeeding frames to the frame of the processing object. Then, the predictive production, processing section 192 predicts and produces, based on the approximate expression, MDCT coefficients which may possibly have been cut or suppressed upon compression coding. Thereafter, the predictive production processing section 192 adopts the produced MDCT coefficients as interpolation data if the predictively produced MDCT coefficients are lower than the resolution.

By the process described, MDCT coefficients which may possibly have been cut or suppressed upon compression coding can be reconstructed over the overall frequency bands including the low, middle and high frequency regions thereby to reconstruct digital audio data free from missing data as seen in FIG. 11C. The predictive production processing section 192 of the processing apparatus of the present second embodiment can reconstruct MDCT coefficients which may possibly have been cut or suppressed upon compression coding and adopt only logically appropriate MDCT coefficients as interpolation data for all frequency bands of the low, middle and high frequency bands.

Then, the digital audio signal in the frequency band reconstructed also with regard to those MDCT coefficients which may possibly have been cut or suppressed upon compression coding as seen in FIG. 11C is inverse DCMT transformed into a signal, in the time axis domain, that is, into a time audio signal by the adaptive block length changeover inverse MDCT section 15. The time audio signal is subject to gain control or gain adjustment by the gain control section 16. Consequently, since MDCT coefficients which may possibly have been cut or suppressed upon compression coding can be reconstructed with a high degree of accuracy, audio data which exhibit high sound quality when they are reproduced can be reconstructed.

Modification to the Second Embodiment

The processing apparatus of the second embodiment, is configured such that the missing signal reconstruction section 19 including the high frequency region addition processing section 191 and the predictive production processing section 192 is interposed between the stereo processing section 13 and the adaptive block length changeover inverse MDCT section 15 as described hereinabove with reference to FIG. 10. In other words, the missing signal reconstruction section 19 is provided, in the inside of the decoder for reconstructing a compression-coded digital audio signal into an audio signal in the time axis domain. According to the configuration just described, audio signals which have been cut or suppressed, can be reconstructed, appropriately in response to a decoding method according to an object compression coding system, in the present embodiment, according to the AAC system.

However, various compression coding systems are available. Therefore, it is possible to provide the missing signal reconstruction, section 19 outside the decoder as seen in FIG. 12 so that audio signal components which may possibly have been cut or suppressed upon compression coding are reconstructed independently of the compression coding system to improve the sound quality of the reproduced audio. In particular, FIG. 12 shows the modified form of the processing apparatus of the second embodiment.

Referring to FIG. 12, a format analysis section 11, a dequantization processing section 12, a stereo processing section 13, an adaptive block length changeover inverse MDCT section 15, a gain control section 16 and a missing signal reconstruction section 19 are configured similarly to those of the processing apparatus described hereinabove with reference to FIG. 10. Therefore, detailed description of the format analysis section 11, dequantization processing section 12, stereo processing section 13, adaptive block length, changeover inverse MDCT section 15, gain control section 16 and missing signal reconstruction section 14 is omitted herein to avoid redundancy.

In the modified processing apparatus shown in FIG. 12, an audio signal outputted from the gain control section 16 already has a form of an audio signal in the time axis domain, that is, a form of a time audio signal. Therefore, an MDCT section 17 is provided such that if MDCT transforms the time audio signal from the gain control section 16 into MDCT coefficients which are audio signal components in the frequency domain again. Then, the MDCT coefficients are supplied to the missing signal reconstruction section 19 provided at the next stage to the MDCT section 17.

The missing signal reconstruction section 19 is configured similarly to the missing signal reconstruction section 19 used in the processing apparatus shown in FIG. 10 as described hereinabove. In particular, the missing signal reconstruction section 19 first uses, for each frame, existing MDCT coefficients in the middle and low frequency regions to reconstruct high frequency signal components which have been cut or suppressed upon compression coding. Then, the missing signal reconstruction section 19 detects, from the MDCT coefficients in all frequency bands of the low, middle and high frequency regions, signal positions at which MDCT coefficients may possibly have been cut or suppressed upon compression coding. Then, the inverse MDCT section 18 predicts and produces the MDCT coefficients, that is, audio signal components, at the detected signal positions, and adopts the produced MDCT coefficients as interpolation data if they are appropriate in view of the resolution. Consequently, also the MDCT coefficients in the high frequency region which have been cut or suppressed upon compression coding are reconstructed, and a digital audio signal which includes full MDCT coefficients in all frequency bands including the low, middle and high frequency band can be reconstructed.

Then, the MDCT coefficients in all of the low, middle and high frequency bands from the high frequency region addition section 192 are supplied to an inverse MDCT section 18, by which they are inverse MDCT transformed back into audio signal components in the time axis domain which can be utilized. In this manner, also where the missing signal reconstruction section 19 is provided outside the decoder, the present invention can be applied, and it is possible to reconstruct, in all frequency bands, audio signal components which may possibly have been cut or suppressed upon the compression coding process. Consequently, it is possible to reproduce the audio having good sound quality.

It is to be noted that, in the foregoing description of the embodiments, a case wherein an audio signal component in a particular frequency region is missing is described as an example. However, the present invention is applicable not only to a case wherein an audio signal is missing completely but also to another case wherein a signal remains partly as seen in FIG. 13A, that is, an audio signal within a particular frequency remains is suppressed.

In particular, a signal which is suppressed but is not fully missing may sometimes remain as seen within a range a of FIG. 13A. It is considered that this arises from the accuracy in calculation at a compression processing step or the like.

Also where a suppressed signal remains as seen in FIG. 13A, a predicted signal can be filled at a missing signal position within the middle frequency region as seen in FIG. 13E.

Further, predictively reconstructed audio signals in the middle and low frequency regions illustrated in FIG. 138 can be referred to predictively reconstruct audio signals within ranges b and c.

[Brief]

The processing apparatus of the first and second embodiments described hereinabove can achieve improvement of the sound quality of a decoded audio signal by using a system for decompressing and decoding a compression-coded, digital audio signal. In particular, based on an audio signal whose signal components are cut, suppressed or omitted in order to raise the compression ratio upon coding, original audio signal components are predictively predicted and produced. By adding thereto, the sound quality of the decoded audio signal can be improved.

More particularly, in case of the processing apparatus of the first embodiment, the audio signal decoding system first uses existing coded signal components to predictively produce missing signal components in the middle and low frequency bands and then duplicates high frequency signal components on the predictively produced signal components thereby to reduce the number of missing signals to improve the sound quality.

On the other hand, in the case of the processing apparatus of the second, embodiment, the order of process is changed from that in the processing apparatus of the first embodiment, and existing coded signals are used to duplicate high frequency signal components first. Then, missing signals in all frequency bands are predictively produced so that the number of missing signals is further reduced to improve the sound quality.

Further, by dividing the process into two different, processes such as a process of "predictive production of a missing signal" and another process of "high frequency region addition", the number of missing signals can be further reduced. Thus, an audio signal from which natural audio can be reproduced can be obtained. In other words, since not only reconstruction of high frequency signal components can be performed but also missing signal components in all frequency bands can be reconstructed appropriately. Therefore, an audio signal from which natural audio can be reproduced can be obtained.

Further, in the processing apparatus of the first embodiment, (1) signal positions of a compression-coded digital audio signal at which signal components may possibly have been cut or suppressed upon compression coding are detected first, and then audio data at the signal positions are produced by prediction. Then, when it is decided that the produced audio data are logically correct, the produced audio data are adopted as interpolation data. Then, after the series of processes described, (2) digital audio data interpolated with the interpolation data are used to reconstruct the audio data on the high frequency band. However, the stage (1) and the stage (2) need not necessarily exist.

In particular, only if the processes at the stage (1) are executed, the quality of the compression coded digital audio signal can be improved. Then, where digital audio signal components in the middle and low frequency bands interpolated at signal positions at which audio signal components have been cut or suppressed are used to reconstruct audio data on the high frequency band side, the audio signal components also on the high frequency band side can be improved in quality. Consequently, digital audio data with which audio of high sound quality can be reproduced over all frequency bands can be reconstructed.

Further, it can be selected suitably following two techniques. The technique of the first embodiment wherein, based on an existing compression-coded digital audio signal, audio data at signal positions at which audio signals are cut or suppressed are reconstructed first and then high frequency audio signal components are reconstructed should be used. The technique of the second embodiment wherein existing compression-coded digital audio signals are used to reconstruct, from audio signals over all frequency bands, wide frequency band audio signal components first and then audio data at signal positions at which audio signals have been cut or suppressed because of a low resolution should be used.

Further, the processing apparatus of the first embodiment and the modification thereto described hereinabove with reference to FIGS. 2 to 9 are configured with the method of the present invention applied thereto. More particularly, the method of the present invention is used by the missing signal reconstruction section 14.

Further, the process executed by the predictive production processing section 141 of the missing signal reconstruction section 14 described hereinabove with reference to FIG. 7 and the process executed by the high frequency region addition section 142 of the missing signal reconstruction section 14 described with reference to FIG. 8 may be implemented by a program (software). The program may be installed into an apparatus which performs a decoding process for a compression-coded digital audio signal and executed by a computer of the apparatus. By this, the present invention can foe applied to various apparatus which perform a signal process for a compression-coded digital audio signal.

Meanwhile, the processing apparatus of the second embodiment and the modification thereto described hereinabove with reference to FIGS. 10 to 12 are configured with the method of the present invention applied thereto. In particular, the method according to an embodiment of the present invention is used by the missing signal reconstruction section 19.

Further, the process executed by the high frequency region addition processing section 191 of the missing signal reconstruction section 19 and the process executed by the predictive production processing section 192 of the missing signal reconstruction section 19 may be implemented by a program (software). The process executed by the high frequency region addition processing section 191 is basically similar to that executed by the high frequency region addition section 142 in the processing apparatus of the first embodiment described hereinabove with reference to FIG. 8. The process executed, by the predictive production processing section 192 is basically same as that executed by the predictive production processing section 141 in the processing apparatus of the first, embodiment described with reference to FIG. 7. The program may be installed into an apparatus which performs a decoding process for a compression-coded digital audio signal and executed by a computer of the apparatus. By this, the present invention described in connection with the processing apparatus of the second embodiment can be applied to various apparatus which perform a signal process for a compression-coded digital audio signal.

A reproduction apparatus to which the reproduction method according to an embodiment of the present invention can be implemented by providing a D/A converter, a processing section, and a reproduction section at the last, stage of any of the processing apparatus described hereinabove with reference to FIGS. 2, 9, 10 and 12. The D/A converter is configured to perform digital/analog conversion of a decoded digital audio signal to form an analog audio signal. The processing section is configured to perform necessary process such as an amplification process for amplifying the audio signal in the form of an analog signal obtained by the D/A converter. The reproduction section is configured to reproduce the audio signal from the processing section.

Further, in FIGS. 2, 9, 10 and 12, the functions or processes which can be formed as a program (software) are not limited to the functions of the predictive production processing section 141 and the high frequency region addition section 142 of the missing signal reconstruction section 14 or the functions of the high frequency region addition processing section 191 and the predictive production processing section 192 of the missing signal reconstruction section 19. Also the processes of the format analysis section 11, dequantisation processing section 12, stereo processing section 13, missing signal reconstruction section 14, adaptive block length changeover inverse MDCT section 15, gain control section 16, MDCT section 17 and inverse MDCT section 18 can naturally be implemented by a program which can be executed by a computer incorporated in a processing apparatus. The computer may be a microcomputer wherein a CPU (Central Processing Unit), a ROM (Read Only Memory), a RAM (Random Access Memory), a nonvolatile memory such as an EEPROM (Electrically Erasable and Programmable ROM) and so forth are interconnected by a CPU bus.

In particular, the processes of the blocks shown in FIGS. 2, 7, 8, 9, 10 and 12 can be implemented by a program. Naturally, also it is possible to implement the blocks shown in FIGS. 2, 9, 10 and 12 from hardware as described hereinabove.

It is to be noted that, while, in the embodiments and the modifications described hereinabove, a digital audio signal of the MPEG-2 AAC system of two left and right channels is processed as an example, the signal to be processed is not limited to this. The present invention can be applied also to a digital audio signal of the MPEG-2 AAC system of multi-channels. Further, the present invention can be applied also to other coded signals. For example, the present invention can be applied also to coded signals compression-coded by the other MPEG systems, ATRAC® system, AC-3® system, WMA® and so forth.

While, in the embodiments described hereinabove, a method of producing an approximate expression by the least squares method to predict a missing signal is used as a prediction method for a missing signal, an interpolation polynomial may be used in place of the approximate expression. Also a method of producing a predictor and using a prediction value outputted from the predictor is applicable. For the predictor, a predictor defined by the ISO/IEC13818-7 or the like may be used, or also it is possible to use other various predictors.

Further, while, in the embodiments and the modifications described hereinabove, the technique disclosed in Japanese Patent Laid-open Ho. 2002-252562, "Device and method for digital signal processing as well as One-bit signal production device" is used to reconstruct high frequency signal components, the reconstruction method is not limited to this. For reconstruction of high frequency signal components, other various techniques can be used.

Further, in the embodiments and the modifications described above, the compression coding process of the MPEG-2 AAC system corresponds to a predetermined signal conversion process, and a coded audio signal formed by a compression coding process of the MPEG-2 AAC system corresponds to a digital signal in a signal conversion processed state processed by signal conversion. However, the signal conversion process is not limited to various compression coding processes.

For example, where an audio signal compression-coded in accordance with a predetermined compression coding system is subject to a decoding process and then converted into and provided as an analog audio signal while the present invention is not applied, the analog audio signal is coded and provided while it is in a state wherein some signal component is missing as a result of the preceding compression coding.

Therefore, after the analog audio signal is converted into a digital signal and then converted into such a state that an additional signal corresponding to a missing signal component can be formed from the digital audio signal to form an object conversion signal as in the case of the embodiments described hereinabove, the present invention may be applied. In this instance, a signal component which may possibly have been removed is formed as an additional signal from the digital signal in a signal conversion processed state, and the digital audio signal is processed taking the additional signal into consideration.

Then, upon reproduction of the digital audio signal after the signal conversion process, also the corresponding additional signal is taken into consideration to reconstruct the digital audio signal into a state of the original analog audio signal, which is reproduced. By this, also from the audio signal from which some signal component has been removed, an audio signal from which audio of high quality can be reproduced can be reconstructed.

The conversion process into a digital signal and the process of converting the digital signal into a state wherein an additional signal corresponding to a removed signal component can be formed from the digital signal are different in a strict sense from a compression coding process. However, also in such an instance, the present invention can be applied. In particular, the signal conversion process includes also a process of converting, where a main signal of an object of processing such as an audio signal lacks in some signal components thereof by some reason, the audio signal into a state wherein it is possible to produce the lacking signal components as additional information.

Further, while, in the embodiments and the modifications described above, a compression-coded audio signal is a processing object, the present invention can be applied also where the processing object is various signals from which some signal component may possibly have been removed, by various processes such as, for example, an image signal.

It should be understood by those skilled in the art that various modifications, combinations, sub-combinations and alterations may occur depending on design requirements and other factors insofar as they are within the scope of the appended claims or the equivalents thereof.

What is claimed is:

1. A digital signal, processing apparatus, comprising:

a detection section configured to detect a signal position at which a signal component may possibly have been removed from a digital signal in a signal conversion processed state upon the signal conversion process;

a prediction section configured to predict, based on data at correlating portions of the digital signal in the signal conversion processed state in a demodulation frequency band which are estimated to have correlations to the signal position, data at the signal position prior to the removal detected by the detection section; and a decision section configured to decide whether or not the absolute value of the data at the signal position prior to the removal predicted by the prediction section is lower than a resolution at the signal position and adopt the predicted data prior to the removal as interpolation data when the absolute value is lower than the resolution.

2. The digital signal processing apparatus according to claim 1, wherein the prediction section predicts the data at the signal position prior to the removal based on existing digital signal components within the demodulation frequency band formed by the signal conversion process.

3. The digital signal processing apparatus according to claim 2, further comprising an addition section configured to reconstruct, from digital signal components in the demodulation frequency band formed by a signal conversion process after the digital signal is interpolated with the data adopted by the decision section from among the data at the removed position prior to the removal predicted by the prediction section, a frequency component in a higher frequency region than the demodulation frequency band and add the reconstructed frequency component.

4. The digital signal processing apparatus according to claim 1, further comprising an addition section configured to reconstruct, from existing digital signal components in the demodulation frequency band formed by the signal conversion process, a frequency component in a higher frequency region than the demodulation frequency band and add the reconstructed frequency component, wherein the detection section sets the digital signal to which the signal component in the frequency band higher than the demodulation frequency band is added by the addition section as a processing object.

5. A digital signal, processing method, comprising the steps of:

detecting a signal position at which a signal component may possibly have been removed from a digital signal in a signal conversion processed state upon the signal conversion process;

predicting, based on data at correlating portions of the digital signal in the signal conversion processed state which are estimated to have correlations to the signal position, data at the signal position prior to the removal detected at the detection step; and deciding whether or not the absolute value of the data at the signal position prior to the removal predicted at the prediction step is lower than a resolution at the signal position and adopt the predicted data prior to the removal as interpolation data when the absolute value is lower than the resolution.

6. The digital signal processing method according to claim 5, wherein the prediction step predicts the data at the signal position prior to the removal based on existing digital signal components within the demodulation frequency band formed at the signal conversion process.

7. The digital signal processing method according to claim 6, wherein the data at the removed position prior to the removal predicted at the prediction step is reconstructed at a reconstruction step of reconstructing, from digital signal components in the demodulation frequency band formed at a signal conversion process after the digital signal is interpolated with the data adopted at the decision step, a frequency component in a higher frequency region than the demodulation frequency band and add the reconstructed frequency component.

8. The digital signal processing method according to claim 5, further comprising the step of adding, from existing digital signal components in the demodulation frequency band formed at the signal conversion process, a frequency component in a higher frequency region than the demodulation frequency band to reconstruct and add the reconstructed frequency component, wherein the detection step sets the digital signal to which the signal component in the frequency band higher than the demodulation frequency band is added at the addition step as a processing object.

9. A digital signal reproduction apparatus, comprising:

a detection section configured to detect a signal position at which, a signal component may possibly have been removed from a digital signal in a signal conversion processed state upon the signal conversion process;

a prediction section configured to predict, based on data at correlating portions of the digital signal in the signal conversion processed state in a demodulation frequency band which are estimated to have correlations to the signal position, data at the signal position prior to the removal detected by the detection section;

a decision section configured to decide whether or not the absolute value of the data at the signal position prior to the removal predicted by the prediction section is lower than a resolution at the signal position and adopt the predicted data prior to the removal as interpolation data when the absolute value is lower than the resolution;

an addition section configured to reconstruct, from digital signal components in the demodulation frequency band interpolated with those of the data at the signal position prior to the removal predicted by the prediction section which are adopted by the decision section, a frequency component in a higher frequency region than the demodulation frequency band and add the reconstructed frequency component;

a reconstruction section configured to perform a reconstruction process for the digital signal in the signal conversion processed state to which the frequency component in the higher frequency band is added by the addition section to reconstruct the digital signal in the state prior to the signal conversion process; and a reproduction section configured to reproduce the digital signal reconstructed by the reconstruction section.

10. A digital signal reproduction apparatus, comprising:

an addition section configured to reconstruct, from existing digital signal components in a demodulation frequency band formed by a signal conversion process, a frequency component in a higher frequency region than the demodulation frequency band and add the reconstructed frequency component;

a detection section configured to detect a signal position at which a signal component may possibly have been removed, upon the signal conversion process, from a digital signal in the signal conversion processed state to which the frequency component in the higher frequency region is added by the addition section;

a prediction section configured to predict, based on data at correlating portions of the digital signal in the signal conversion processed state which are estimated to have correlations to the signal position, data at the signal position prior to the removal detected by the detection section;

a decision section configured to decide whether or not the absolute value of the data at the signal position prior to the removal predicted by the prediction section is lower than a resolution at the signal position and adopt the predicted data prior to the removal as interpolation data when the absolute value is lower than the resolution;

a reconstruction section configured to perform a reconstruction process for the digital signal in the signal conversion processed state interpolated by the data to be decided by the decision section to reconstruct the digital signal in the state prior to the signal conversion process; and a reproduction section configured to reproduce the digital signal reconstructed by the reconstruction section.

* * * * *